(12) United States Patent
Sasagawa et al.

(10) Patent No.: US 9,372,338 B2
(45) Date of Patent: Jun. 21, 2016

(54) MULTI-STATE INTERFEROMETRIC MODULATOR WITH LARGE STABLE RANGE OF MOTION

(71) Applicant: QUALCOMM MEMS Technologies, Inc., San Diego, CA (US)

(72) Inventors: Teruo Sasagawa, Los Gatos, CA (US); Richard Yeh, Sunnyvale, CA (US); Kostadin Dimitrov Djordjev, San Jose, CA (US); Hrishikesh Vijaykumar Panchawagh, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 11 days.

(21) Appl. No.: 14/265,193

(22) Filed: Apr. 29, 2014

(65) Prior Publication Data

US 2015/0205092 A1   Jul. 23, 2015

Related U.S. Application Data

(60) Provisional application No. 61/928,953, filed on Jan. 17, 2014.

(51) Int. Cl.
 *G02B 26/00* (2006.01)
 *B81C 1/00* (2006.01)
 (Continued)

(52) U.S. Cl.
 CPC ............... *G02B 26/001* (2013.01); *B81B 3/00* (2013.01); *B81C 1/00134* (2013.01); *G02B 1/12* (2013.01); *G02B 26/007* (2013.01); *G02B 26/0841* (2013.01)

(58) Field of Classification Search
 CPC ........ B81B 3/00; B81C 1/00134; G02B 1/12; G02B 26/001; G02B 26/007
 USPC ............ 359/291, 259, 260, 290–29, 212, 214
 See application file for complete search history.

(56) References Cited

U.S. PATENT DOCUMENTS 5,867,202 A    2/1999   Knipe et al.
6,329,738 B1   12/2001  Hung et al.
(Continued)

OTHER PUBLICATIONS

Cortopassi C., et al., "Nonlinear Springs for Increasing the Maximum Stable Deflection of MEMS Electrostatic Gap Closing Actuators," 2009, 4 pages.
(Continued)

*Primary Examiner* — Tuyen Tra
(74) *Attorney, Agent, or Firm* — Knobbe, Martens, Olson & Bear, LLP

(57) ABSTRACT

This disclosure provides systems, methods and apparatus relating to electromechanical display devices. In one aspect, a multi-stage interferometric modulator (IMOD) can include a movable reflector that can be moved to different positions to produce different reflected colors. The IMOD can include deformable elements that are coupled to a back side of the movable reflector and provide support to the movable reflector. The deformable elements can provide a restoring force that biases the movable reflector to a resting position. The IMOD can include one or more restoring force modifiers that are configured to increase the restoring force when engaged. The restoring force modifiers can be between the movable reflector and the deformable elements such that the deformable elements contact the restoring force modifiers when the movable reflector is displaced to a contacting position.

26 Claims, 23 Drawing Sheets

(51) Int. Cl.
  *G02B 1/12* (2006.01)
  *B81B 3/00* (2006.01)
  *G02B 26/08* (2006.01)

(56) References Cited

U.S. PATENT DOCUMENTS

| | | | |
|---|---|---|---|
| 6,710,908 | B2 | 3/2004 | Miles et al. |
| 6,806,545 | B2 | 10/2004 | Shim |
| 7,486,854 | B2 | 2/2009 | Van Ostrand et al. |
| 7,532,377 | B2 | 5/2009 | Miles |
| 7,567,373 | B2 | 7/2009 | Chui et al. |
| 7,612,932 | B2 | 11/2009 | Chui et al. |
| 7,859,740 | B2 | 12/2010 | Tung |
| 7,944,599 | B2 | 5/2011 | Chui et al. |
| 8,164,821 | B2 | 4/2012 | Gudlavalleti et al. |
| 8,270,062 | B2 | 9/2012 | Kothari et al. |
| 8,314,984 | B2 | 11/2012 | Yang et al. |
| 2002/0126364 | A1* | 9/2002 | Miles .................... 359/247 |
| 2003/0098618 | A1 | 5/2003 | Greenberg et al. |
| 2005/0146241 | A1 | 7/2005 | Wan et al. |
| 2006/0024880 | A1* | 2/2006 | Chui et al. ............. 438/222 |
| 2008/0142347 | A1* | 6/2008 | Lewis et al. ............ 200/181 |
| 2009/0127082 | A1 | 5/2009 | Zhang et al. |
| 2013/0335808 | A1 | 12/2013 | Sasagawa |
| 2014/0092110 | A1 | 4/2014 | Chan et al. |

OTHER PUBLICATIONS

Burns et al., "Nonlinear flexures for stable deflection of an electrostatically actuated micromirror," SPIE vol. 3226, 2011, pp. 125-136.
International Search Report and Written Opinion—PCT/US2014/070630—ISA/EPO—Mar. 16, 2015.

* cited by examiner

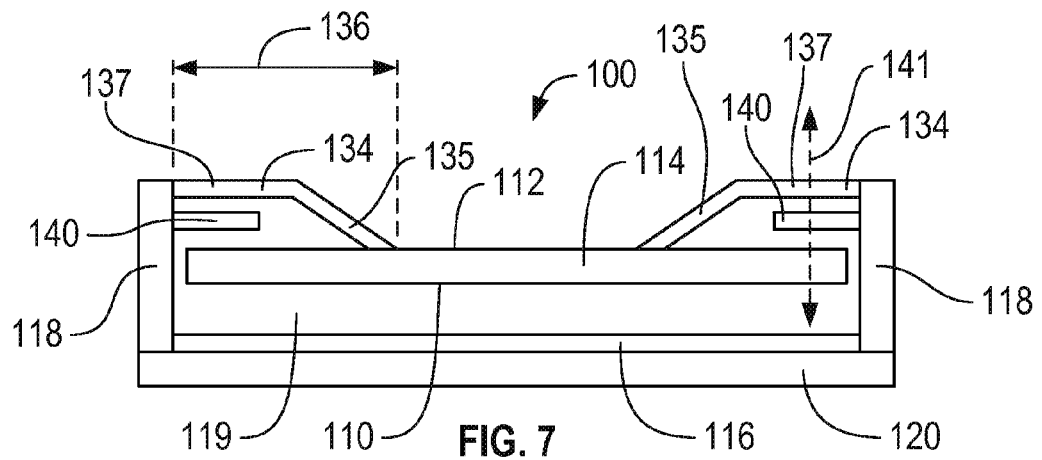
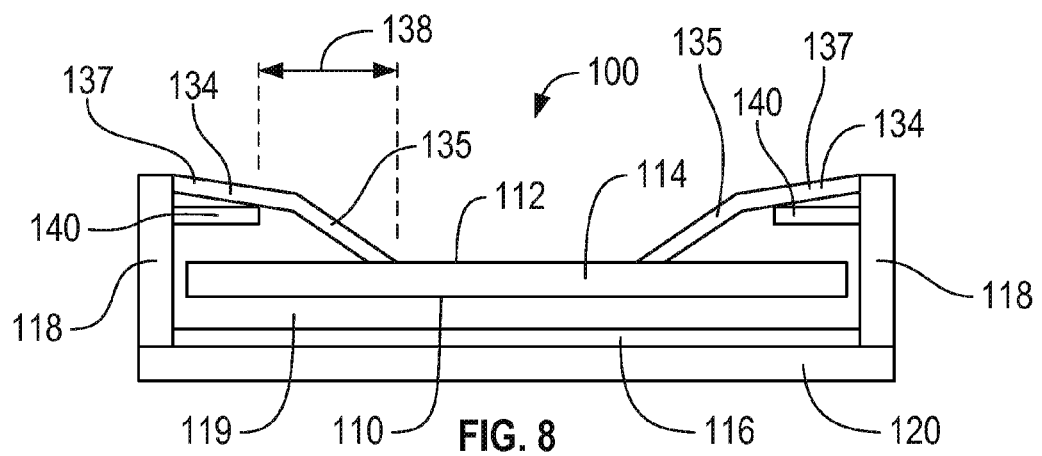
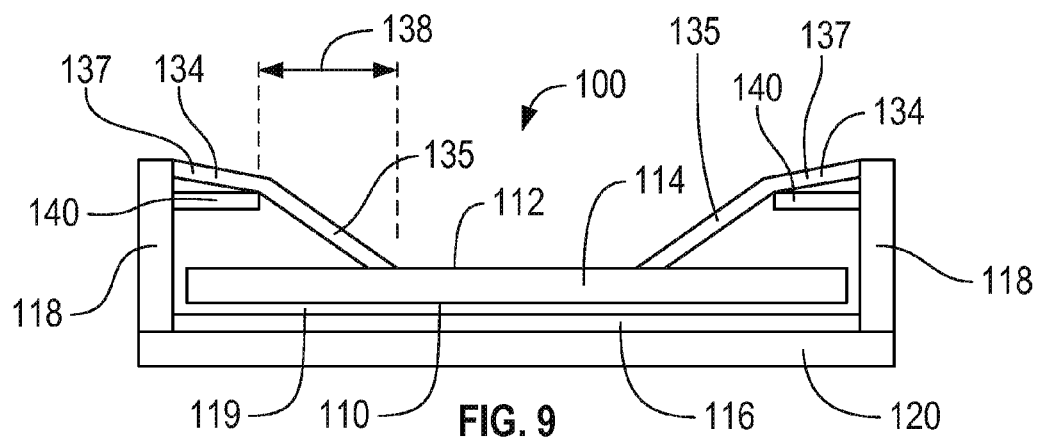

MULTI-STATE INTERFEROMETRIC MODULATOR WITH LARGE STABLE RANGE OF MOTION

CROSS-REFERENCE TO RELATED APPLICATIONS

This patent application claims priority to U.S. Provisional Patent Application No. 61/928,953 filed Jan. 17, 2014 entitled "MULTI-STATE INTERFEROMETRIC MODULATOR WITH LARGE STABLE RANGE OF MOTION." The disclosure of the prior Application is considered part of and is incorporated by reference in this Patent Application.

TECHNICAL FIELD

This disclosure relates to electromechanical systems and display devices for displaying images and, more particularly, to multi-state or analog interferometric modulators (IMODs) that have a large stable range of motion.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Various colors can be output by the IMOD by varying the distance between the two plates. In some IMODs one or both of the plates can have a limited stable range of motion. For example, in some cases, when the distance between the two plates is below a threshold value, the two plates can transition to a fully closed position. The limited stable range of motion can limit the colors that can reliably be produced by the IMOD. Accordingly, there is a need for IMODs that have a large stable range of motion.

SUMMARY

The systems, methods and devices of this disclosure each have several innovative aspects, no single one of which is solely responsible for the desirable attributes disclosed herein.

One innovative aspect of the subject matter described in this disclosure can be implemented in an interferometric modulator, which can include a substrate, an optical stack supported by the substrate, wherein the optical stack can be partially reflective and partially transmissive, and a movable reflector over the optical stack. The movable reflector can include a front side facing the optical stack and a back side opposite the front side. The optical stack and the movable reflector can define an optical cavity therebetween. The interferometric modulator can include a deformable element coupled to the back side of the movable reflector. The deformable element can be capable of providing a restoring force to bias the movable reflector to a first position. The interferometric modulator can include a restoring force modifier between the movable reflector and the deformable element, and the interferometric modulator can be configured such that the restoring force modifier increases the restoring force of the deformable element when the deformable element is in contact with the restoring force modifier.

In some implementations, the restoring force modifier can be configured such that the deformable element does not contact the restoring force modifier when the movable reflector is in the first position, such that the deformable element contacts the restoring force modifier when the movable reflector is in a second position, and such that the deformable element contacts the restoring force modifier when the movable reflector is in a third position, and the second position can be between the first position and the third position.

In some implementations, the deformable element can have a first spring constant when the movable reflector is between the first position and the second position, and the deformable element can have a second spring constant that is higher than the first spring constant when the movable reflector is between the second position and the third position.

In some implementations, the interferometric modulator can be capable of reflecting a first color of light when the movable reflector is at the first position, the interferometric modulator can be capable of reflecting a second color of light when the movable reflector is at the second position, and the interferometric modulator can be capable of reflecting a third color of light when the movable reflector is at the third position.

In some implementations, the restoring force can be at least partially defined by a first length of the deformable element when the deformable element does not contact the restoring force modifier, wherein the restoring force can be at least partially defined by a second length of the deformable element when the deformable element contacts the restoring force modifier, and the second length can be shorter than the first length.

In some implementations, the restoring force can be at least partially defined by a first region of the deformable element when the restoring force modifier is in contact with the deformable element, and the restoring force can be at least partially defined by the first region and a second region of the deformable element when the restoring force modifier is not in contact with the deformable element.

In some implementations, the interferometric modulator can include a post that supports the movable reflector above the optical cavity, and the restoring force modifier can include a protrusion extending generally horizontally from the post.

In some implementations, a line normal to the front side of the movable reflector can intersect the restoring force modifier.

In some implementations, the interferometric modulator can be capable of selectively actuating the movable reflector towards the optical stack and away from the optical stack.

In some implementations, the interferometric modulator includes a flexible element between the restoring force modifier and the movable reflector, and the flexible element can be capable of increasing the restoring force when the movable reflector is actuated away from the optical stack.

In some implementations, the movable reflector can be capable of flexing to increase the restoring force when the movable reflector is actuated away from the optical stack.

In some implementations, the interferometric modulator can include an additional restoring force modifier, and the deformable element can be between the movable reflector and the additional restoring force modifier, and the additional restoring force modifier can be capable of increasing the restoring force when the movable reflector is actuated away from the optical stack.

In some implementations, the interferometric modulator can include a second restoring force modifier. The deformable element can be capable of contacting the restoring force modifier when the movable reflector is at a first contacting position, and the deformable element can be capable of contacting the second restoring force modifier when the movable reflector is deflected past the first contacting position, and the second restoring force modifier can further increase the restoring force when the deformable element contacts the second restoring force modifier.

In some implementations, the movable reflector can include an electrode, and the deformable element can include an electrically conductive portion that is electrically coupled to the electrode of the movable reflector.

In some implementations, the front side of the movable reflector can include the electrode, and the movable reflector can include an electrically conductive layer that can extend from the back of the movable reflector to the front of the movable reflector.

Another innovative aspect of the subject matter described in this disclosure can be implemented in an apparatus that includes a plurality of display elements that each includes the interferometric modulator and a processor that is capable of communicating with the plurality of display elements. The processor can be capable of processing image data. The apparatus can include a memory device that is capable of communicating with the processor.

In some implementations, the apparatus can include a driver circuit capable of sending at least one signal to the plurality of display elements and a controller capable of sending at least a portion of the image data to the driver circuit.

In some implementations, the apparatus can include an image source module capable of sending the image data to the processor, and the image source module can include at least one of a receiver, transceiver, and transmitter.

In some implementations, the apparatus can include an input device capable of receiving input data and communicating the input data to the processor.

Another innovative aspect of the subject matter described in this disclosure can be implemented in an interferometric modulator that includes a substrate and an optical stack supported by the substrate. The optical stack can be partially reflective and partially transmissive. The interferometric modulator can include movable means for reflecting light, and the movable light reflecting means can be positioned over the optical stack. The movable light reflecting means can include a front side facing the optical stack and a back side opposite the front side. The optical stack and the movable light reflecting means can define an optical cavity therebetween. The interferometric modulator can include means for biasing the movable light reflecting means to a first position. The biasing means can be coupled to the back side of the movable light reflecting means. The interferometric modulator can include means for modifying a restoring force of the biasing means, and the restoring force modifying means can be between the movable light reflecting means and the biasing means.

In some implementations, movable light reflecting means can include a movable reflector, the biasing means can include a deformable element, and/or the restoring force modifying means can include a restoring force modifier.

Another innovative aspect of the subject matter described in this disclosure can be implemented in a method of manufacturing an interferometric modulator. The method can include forming an optical stack over a substrate, forming a first sacrificial layer over the optical stack, and forming a movable reflector over the first sacrificial layer. The movable reflector can have a front side facing the optical stack and back side opposite the front side. The method can include forming a second sacrificial layer over the movable reflector, forming a restoring force modifier over the second sacrificial layer, forming a third sacrificial layer over the restoring force modifier, forming a deformable element over the third sacrificial layer, removing the first sacrificial layer to create a first gap between the optical stack and the movable reflector, removing the second sacrificial layer to create a second gap between the movable reflector and the restoring force modifier, and removing the third sacrificial layer to create a third gap between the restoring force modifier and the deformable element. The deformable element can be coupled to the back side of the movable reflector upon removal of the sacrificial layers such that the deformable element is configured to provide a restoring force to bias the movable reflector to a first position.

In some implementations, the interferometric modulator can be configured such that the restoring force modifier increases the restoring force when the deformable element is in contact with the restoring force modifier.

In some implementations, a single etchant is used for removing the first sacrificial layer, removing the second sacrificial layer, and removing the third sacrificial layer.

In some implementations, the method can include forming a fourth sacrificial layer over the deformable element, forming an encapsulating layer over the fourth sacrificial layer, and removing the fourth sacrificial layer to create a fourth gap between the deformable element and the encapsulating layer.

In some implementations, the method can include forming a hole through the encapsulating layer to provide access to the sacrificial layers.

In some implementations, forming the movable reflector can include forming an electrode, and forming the deformable element can include forming an electrically conductive layer that is electrically coupled to the electrode.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIG. 7 is a cross-sectional illustration of an example implementation of a multi-state IMOD.

FIG. 8 is a cross-sectional illustration of the multi-state IMOD of FIG. 7 with the movable reflector actuated to a contacting position FIG. 9 is a cross-sectional illustration of the multi-state IMOD of FIG. 7 with the movable reflector actuated past the contacting position.

Like reference numbers and designations in the various drawings indicate like elements.

DETAILED DESCRIPTION

Figure 1:
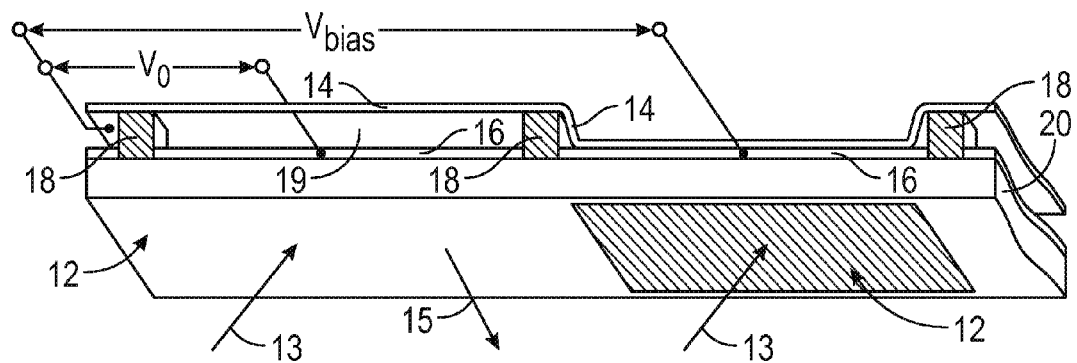
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

In a multi-state or analog IMOD, a movable reflector can be driven to various different positions (e.g., by applying different levels of voltage to one or more electrodes) to produce various different colors (e.g., red, green, blue, white, and/or black). The movable reflector can have a stable range of travel that is smaller than the height of the optical cavity. For example, the movable reflector can be pulled towards an electrode as the applied voltage increases. Within the stable range of motion, the movable reflector can be held in place at various different positions (e.g., by varying the applied voltage). At some point the movable reflector reaches a point of instability where the electrostatic forces on the movable reflector are greater than the restoring force provided by the mechanism that supports the movable reflector. At this point, the movable reflector can actuate to a fully actuated position (e.g., in which the optical gap is closed).

Various implementations disclosed herein relate to a multi-state IMOD that has a large stable range of motion. The IMOD can include one or more deformable elements that support a movable reflector, and the deformable elements can bias the movable reflector toward a resting position. The movable reflector is also commonly referred to as the movable mirror (or simply, mirror). When the movable reflector is moved away from the resting position, the deformable elements can provide a nonlinear restoring force to the movable reflector. As the movable mirror is drawn closer to an electrode and the electrostatic forces increase, the nonlinear restoring force can increase as well, thereby extending the stable range of motion for the movable mirror. Extending the stable range of motion for the movable mirror can increase the range of colors that can be reliably produced by the IMOD. The deformable elements can be coupled to a back of the movable reflector. As such, the deformable elements may be referred to as behind mirror hinges. Because the deformable elements can be disposed behind the movable reflector, the movable reflector can fill a large portion of the IMOD area, which can improve the fill factor of the IMOD and/or of a display that includes the IMODs. The fill factor of a display can be defined as the ratio of the optically active area of the display to the total area of the display. The fill factor of an IMOD can be defined as the ratio of the optically active area of the IMOD to the total area of the IMOD.

In various implementations, the multi-state IMOD can include a restoring force modifier that can be configured to change the restoring force provided by the deformable elements. For example, the restoring force modifier can be out of contact with the deformable elements when the movable reflector is at or near the resting position. The movable reflector can come into contact with the restoring force modifier when the movable reflector is displaced to a contacting position. The restoring force modifier can increase the restoring force of the deformable elements when the movable reflector is displaced past the contacting position. The restoring force can be nonlinear at the contacting position. The one or more deformable elements can function, for example, as one or more cantilever springs. When a deformable element is not in contact with the restoring force modifier, the deformable element can have a first spring constant, and when the deformable element is in contact with the restoring force modifier, the deformable element can have a second spring constant that is higher than the first spring constant. The restoring force modifier can be positioned behind the movable reflector. For example, the restoring force modifier can be positioned between the movable reflector and the deformable element. In some implementations, the restoring force modifier can be a generally horizontal protrusion that extends into the space between the deformable element and the movable reflector. The restoring force modifier can extend from a post that provides support to the movable reflector. In some implementations, the deformable element can extend from the post at a location above the restoring force modifier.

In some implementations, the movable reflector can be actuated in a first direction (e.g., towards an optical stack) and in a second direction (e.g., away from the optical stack). By actuating the IMOD in the first direction and the second direction, additional colors can be produced. The deformable elements can produce a nonlinear restoring force when the movable reflector is actuated in the first direction and/or in the second direction. In some implementations, a first protrusion can be below a deformable element and can modifying the restoring force when the movable reflector is actuated downward (e.g., towards the optical stack). A second protrusion can be above the deformable element and can modify the restoring force when the movable reflector is actuated upward (e.g., away from the optical stack). In some implementations, a flexible element can be between the movable reflector and the restoring force modifier, and the flexible element can be compressed between the movable reflector and the restoring force modifier as the movable reflector is moved upward (e.g., away from the optical stack), thereby increasing the restoring force towards the resting position. In some implementations, the movable reflector can be flexible, and the flexing of the movable reflector can increase the restoring force towards the resting position.

Particular implementations of the subject matter described in this disclosure can be implemented to realize one or more of the following potential advantages. For example, various IMODs disclosed herein can be used to produce a wide range of colors. In some instances, a single IMOD can be used to produce primary colors (e.g., red, green, and blue), which can be combined (spatially or temporally) to produce a set of colors that can be useful for displaying images on a display device. In some instances, a single IMOD can be actuated stably to a large number of positions so that the IMOD can produce a set of colors that can be useful for displaying images on a display device. For example, an IMOD can be actuated stably to 3, 5, 10, 25, 50, 100, 1000, or more positions, and in some instances the IMOD can be actuated stably to a number of positions that approaches infinity. Various implementations disclosed herein can be used to produce a display that has a large fill factor. A large fill factor can improve the brightness of the display and can improve image quality.

An example of a suitable EMS or MEMS device or apparatus, to which the described implementations may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity at least partially defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 µm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in nonlinear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

FIG. 1 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

Figure 2:
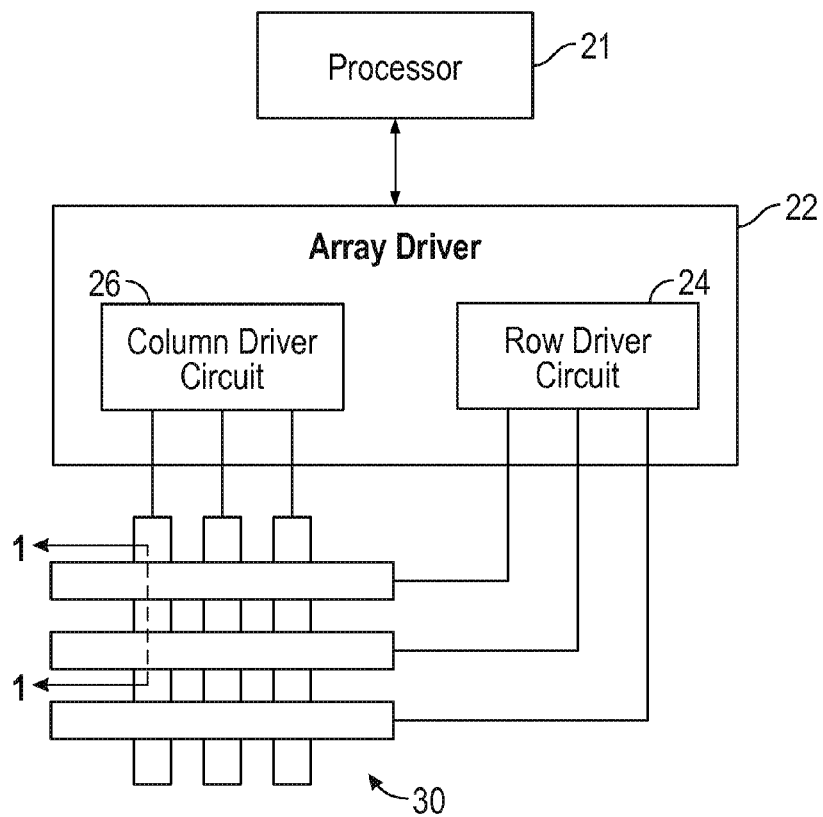
FIG. 2 is a system block diagram illustrating an electronic device incorporating an IMOD-based display including a three element by three element array of IMOD display elements.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
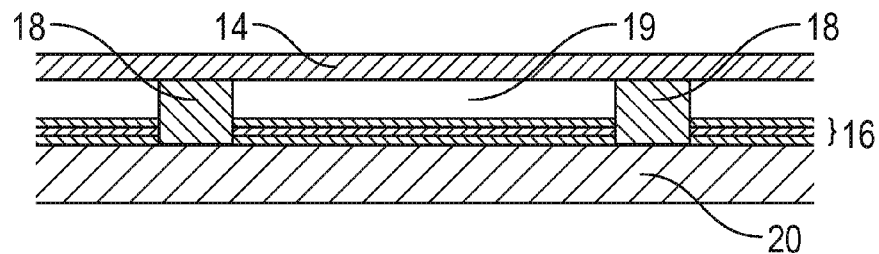
FIGS. 3A-3E are cross-sectional illustrations of varying implementations of IMOD display elements.
Figure 3B:
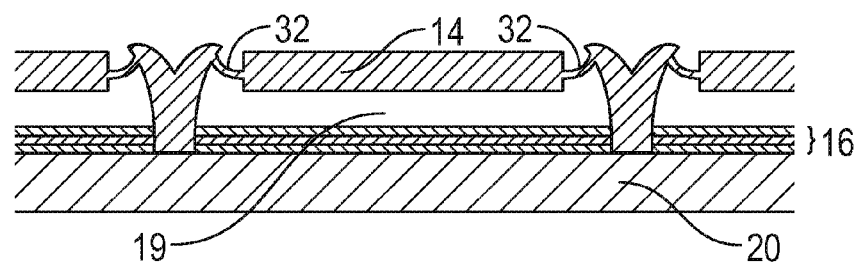
Figure 3C:
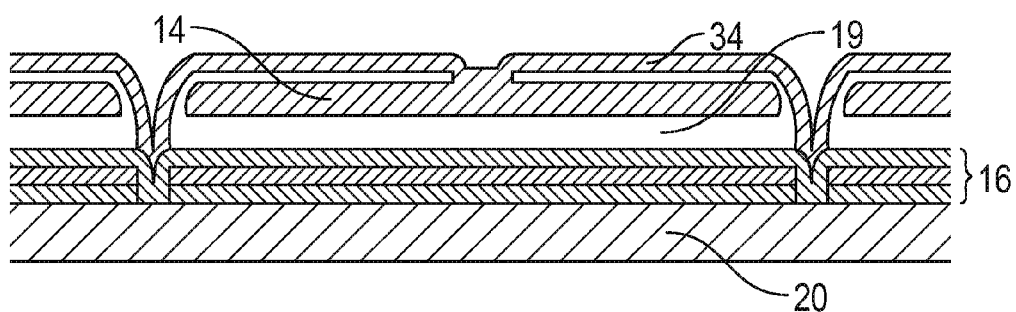

The details of the structure of IMOD displays and display elements may vary widely. FIGS. 3A-3E are cross-sectional illustrations of varying implementations of IMOD display elements. FIG. 3A is a cross-sectional illustration of an IMOD display element, where a strip of metal material is deposited on supports 18 extending generally orthogonally from the substrate 20 forming the movable reflective layer 14. In FIG. 3B, the movable reflective layer 14 of each IMOD display element is generally square or rectangular in shape and attached to supports at or near the corners, on tethers 32. In FIG. 3C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as implementations of "integrated" supports or support posts 18. The implementation shown in FIG. 3C has additional benefits deriving from the decoupling of the optical functions of the movable reflective layer 14 from its mechanical functions, the latter of which are carried out by the deformable layer 34. This decoupling allows the structural design and materials used for the movable reflective layer 14 and those used for the deformable layer 34 to be optimized independently of one another.

Figure 3D:
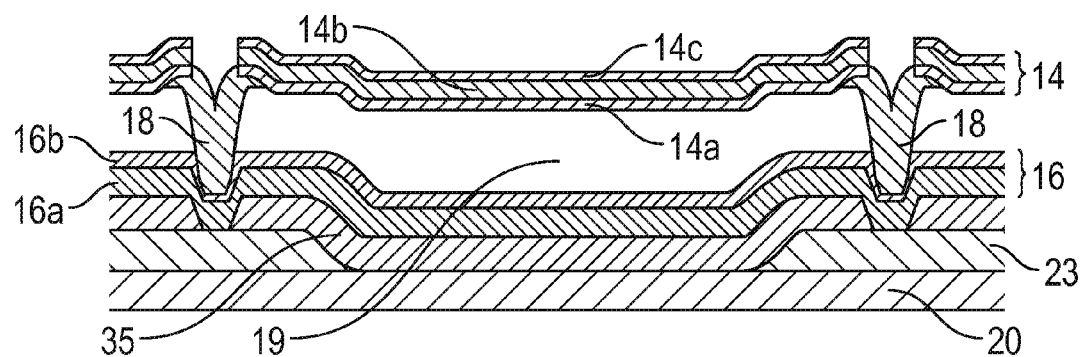

FIG. 3D is another cross-sectional illustration of an IMOD display element, where the movable reflective layer 14 includes a reflective sub-layer 14a. The movable reflective layer 14 rests on a support structure, such as support posts 18. The support posts 18 provide separation of the movable reflective layer 14 from the lower stationary electrode, which can be part of the optical stack 16 in the illustrated IMOD display element. For example, a gap 19 is formed between the movable reflective layer 14 and the optical stack 16, when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2/SiON/SiO_2$ tri-layer stack. Either or both of the reflective sub-layer 14a and the conductive layer 14c can include, for example, an aluminum (Al) alloy with about 0.5% copper (Cu), or another reflective metallic material. Employing conductive layers 14a and 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 3D, some implementations also can include a black mask structure 23, or dark film layers. The black mask structure 23 can be formed in optically inactive regions (such as between display elements or under the support posts 18) to absorb ambient or stray light. The black mask structure 23 also can improve the optical properties of a display device by inhibiting light from being reflected from or transmitted through inactive portions of the display, thereby increasing the contrast ratio. Additionally, at least some portions of the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. In some implementations, the black mask structure 23 can be an etalon or interferometric stack structure. For example, in some implementations, the interferometric stack black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, tetrafluoromethane (or carbon tetrafluoride, $CF_4$) and/or oxygen ($O_2$) for the MoCr and $SiO_2$ layers and chlorine ($Cl_2$) and/or boron trichloride ($BCl_3$) for the aluminum alloy layer. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate electrodes (or conductors) in the optical stack 16 (such as the absorber layer 16a) from the conductive layers in the black mask structure 23.

Figure 3E:
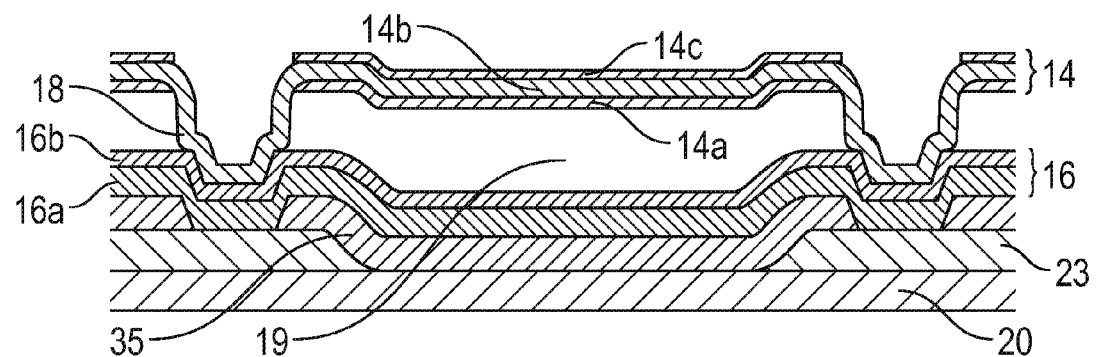

FIG. 3E is another cross-sectional illustration of an IMOD display element, where the movable reflective layer 14 is self-supporting. While FIG. 3D illustrates support posts 18 that are structurally and/or materially distinct from the movable reflective layer 14, the implementation of FIG. 3E includes support posts that are integrated with the movable reflective layer 14. In such an implementation, the movable reflective layer 14 contacts the underlying optical stack 16 at multiple locations, and the curvature of the movable reflective layer 14 provides sufficient support that the movable reflective layer 14 returns to the unactuated position of FIG. 3E when the voltage across the IMOD display element is insufficient to cause actuation. In this way, the portion of the movable reflective layer 14 that curves or bends down to contact the substrate or optical stack 16 may be considered an "integrated" support post. One implementation of the optical stack 16, which may contain a plurality of several different layers, is shown here for clarity including an optical absorber 16a, and a dielectric 16b. In some implementations, the optical absorber 16a may serve both as a stationary electrode and as a partially reflective layer. In some implementations, the optical absorber 16a can be an order of magnitude thinner than the movable reflective layer 14. In some implementations, the optical absorber 16a is thinner than the reflective sub-layer 14a.

In implementations such as those shown in FIGS. 3A-3E, the IMOD display elements form a part of a direct-view device, in which images can be viewed from the front side of the transparent substrate 20, which in this example is the side opposite to that upon which the IMOD display elements are formed. In these implementations, the back portions of the device (that is, any portion of the display device behind the movable reflective layer 14, including, for example, the deformable layer 34 illustrated in FIG. 3C) can be configured and operated upon without impacting or negatively affecting the image quality of the display device, because the reflective layer 14 optically shields those portions of the device. For example, in some implementations a bus structure (not illustrated) can be included behind the movable reflective layer 14 that provides the ability to separate the optical properties of the modulator from the electromechanical properties of the modulator, such as voltage addressing and the movements that result from such addressing.

Figure 4:
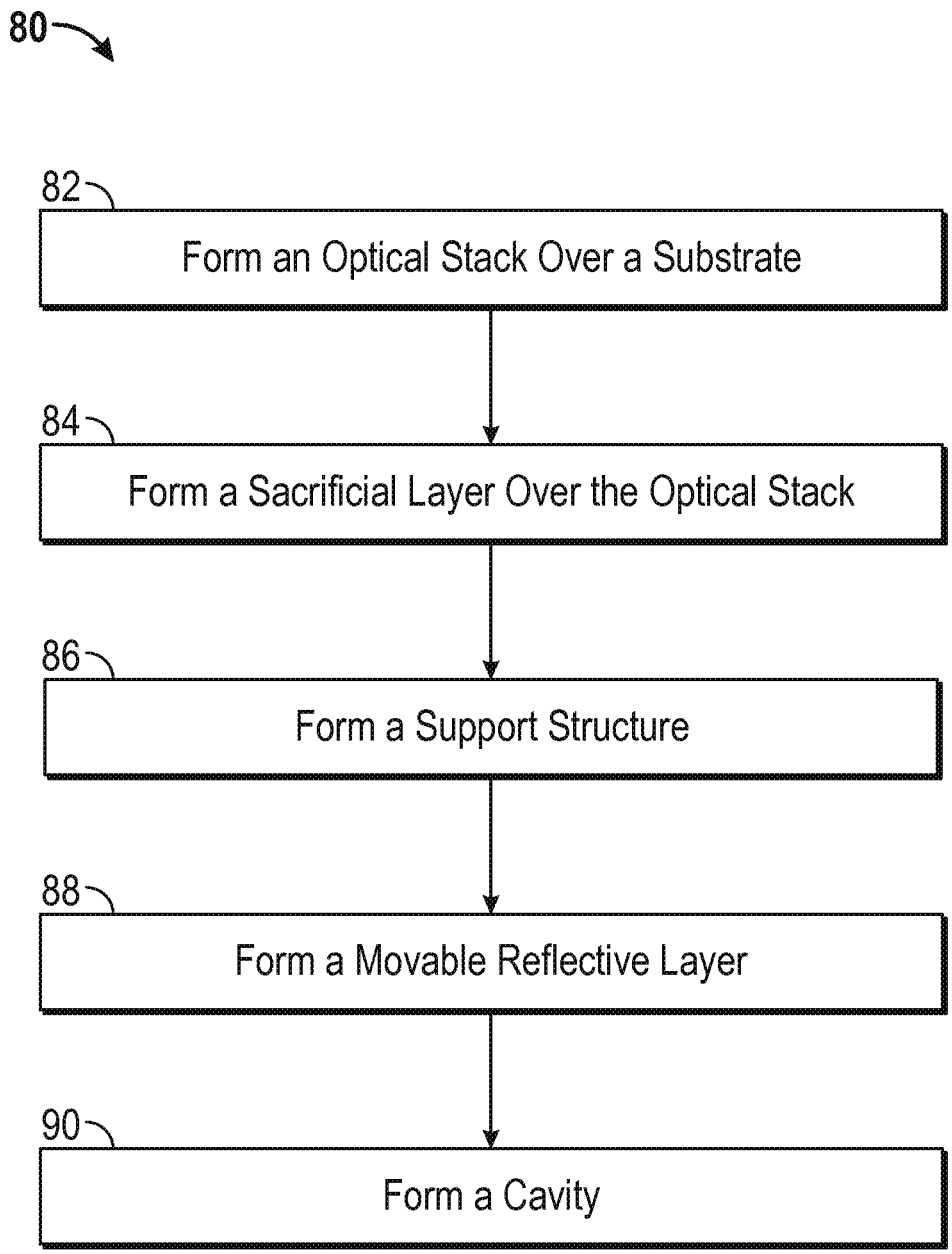
FIG. 4 is a flow diagram illustrating a manufacturing process for an IMOD display or display element.
Figure 5A:
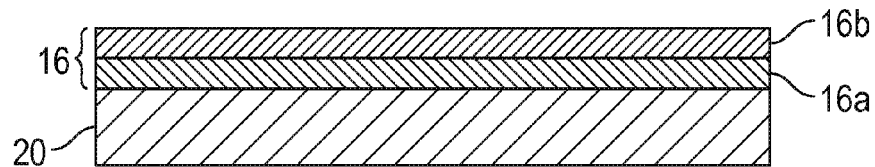
FIGS. 5A-5E are cross-sectional illustrations of various stages in a process of making an IMOD display or display element.

FIG. 4 is a flow diagram illustrating a manufacturing process 80 for an IMOD display or display element. FIGS. 5A-5E are cross-sectional illustrations of various stages in the manufacturing process 80 for making an IMOD display or display element. In some implementations, the manufacturing process 80 can be implemented to manufacture one or more EMS devices, such as IMOD displays or display elements. The manufacture of such an EMS device also can include other blocks not shown in FIG. 4. The process 80 begins at block 82 with the formation of the optical stack 16 over the substrate 20. FIG. 5A illustrates such an optical stack 16 formed over the substrate 20. The substrate 20 may be a transparent substrate such as glass or plastic such as the materials discussed above with respect to FIG. 1. The substrate 20 may be flexible or relatively stiff and unbending, and may have been subjected to prior preparation processes, such as cleaning, to facilitate efficient formation of the optical stack 16. As discussed above, the optical stack 16 can be electrically conductive, partially transparent, partially reflective, and partially absorptive, and may be fabricated, for example, by depositing one or more layers having the desired properties onto the transparent substrate 20.

In FIG. 5A, the optical stack 16 includes a multilayer structure having sub-layers 16a and 16b, although more or fewer sub-layers may be included in some other implementations. In some implementations, one of the sub-layers 16a and 16b can be configured with both optically absorptive and electrically conductive properties, such as the combined conductor/absorber sub-layer 16a. In some implementations, one of the sub-layers 16a and 16b can include molybdenum-chromium (molychrome or MoCr), or other materials with a suitable complex refractive index. Additionally, one or more of the sub-layers 16a and 16b can be patterned into parallel strips, and may form row electrodes in a display device. Such patterning can be performed by a masking and etching process or another suitable process known in the art. In some implementations, one of the sub-layers 16a and 16b can be an insulating or dielectric layer, such as an upper sub-layer 16b that is deposited over one or more underlying metal and/or oxide layers (such as one or more reflective and/or conductive layers). In addition, the optical stack 16 can be patterned into individual and parallel strips that form the rows of the display. In some implementations, at least one of the sub-layers of the optical stack, such as the optically absorptive layer, may be quite thin (e.g., relative to other layers depicted in this disclosure), even though the sub-layers 16a and 16b are shown somewhat thick in FIGS. 5A-5E.

Figure 5B:
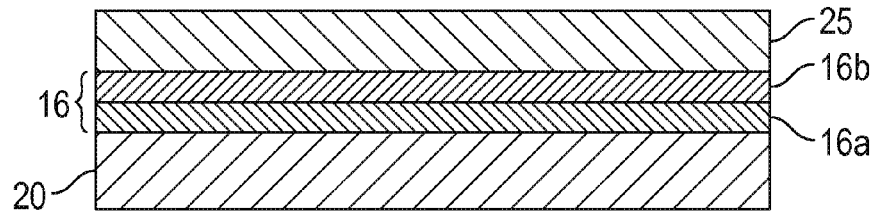

The process 80 continues at block 84 with the formation of a sacrificial layer 25 over the optical stack 16. Because the sacrificial layer 25 is later removed (see block 90) to form the cavity 19, the sacrificial layer 25 is not shown in the resulting IMOD display elements. FIG. 5B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (Si), in a thickness selected to provide, after subsequent removal, a gap or cavity 19 (see also FIG. 5E) having a desired design size. Deposition of the sacrificial material may be carried out using deposition techniques such as physical vapor deposition (PVD, which includes many different techniques, such as sputtering), plasma-enhanced chemical vapor deposition (PECVD), thermal chemical vapor deposition (thermal CVD), or spin-coating.

Figure 5C:
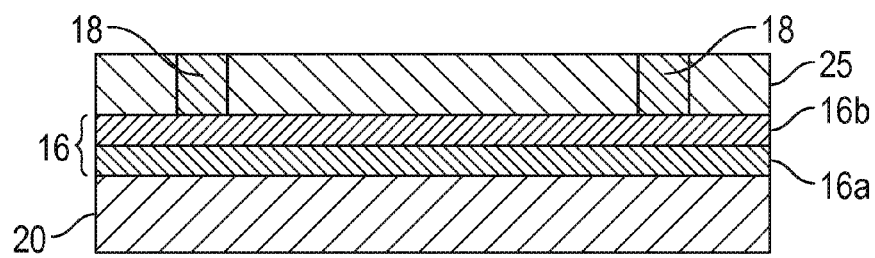

The process 80 continues at block 86 with the formation of a support structure such as a support post 18. The formation of the support post 18 may include patterning the sacrificial layer 25 to form a support structure aperture, then depositing a material (such as a polymer or an inorganic material, like silicon oxide) into the aperture to form the support post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the support post 18 contacts the substrate 20. Alternatively, as depicted in FIG. 5C, the aperture formed in the sacrificial layer 25 can extend through the sacrificial layer 25, but not through the optical stack 16. For example, FIG. 5E illustrates the lower ends of the support posts 18 in contact with an upper surface of the optical stack 16. The support post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 5C, but also can extend at least partially over a portion of the sacrificial layer 25. As noted above, the patterning of the sacrificial layer 25 and/or the support posts 18 can be performed by a masking and etching process, but also may be performed by alternative patterning methods.

Figure 5D:
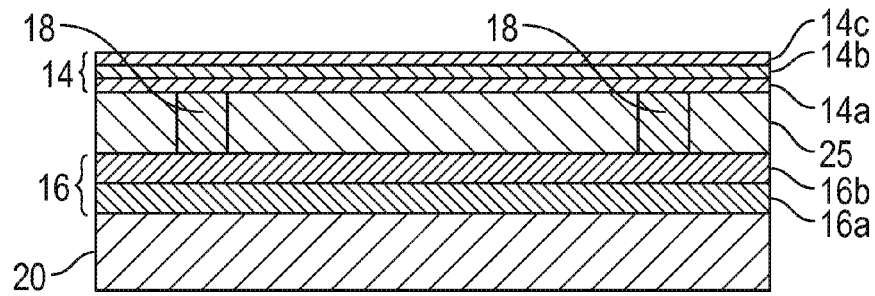
Figure 5E:
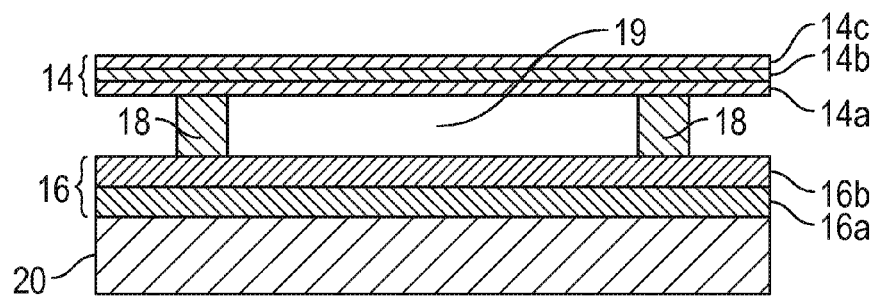

The process 80 continues at block 88 with the formation of a movable reflective layer or membrane such as the movable reflective layer 14 illustrated in FIG. 5D. The movable reflective layer 14 may be formed by employing one or more deposition steps, including, for example, reflective layer (such as aluminum, aluminum alloy, or other reflective materials) deposition, along with one or more patterning, masking and/or etching steps. The movable reflective layer 14 can be patterned into individual and parallel strips that form, for example, the columns of the display. The movable reflective layer 14 can be electrically conductive, and referred to as an electrically conductive layer. In some implementations, the movable reflective layer 14 may include a plurality of sub-layers 14a, 14b and 14c as shown in FIG. 5D. In some implementations, one or more of the sub-layers, such as sub-layers 14a and 14c, may include highly reflective sub-layers selected for their optical properties, and another sub-layer 14b may include a mechanical sub-layer selected for its mechanical properties. In some implementations, the mechanical sub-layer may include a dielectric material. Since the sacrificial layer 25 is still present in the partially fabricated IMOD display element formed at block 88, the movable reflective layer 14 is typically not movable at this stage. A partially fabricated IMOD display element that contains a sacrificial layer 25 also may be referred to herein as an "unreleased" IMOD.

The process 80 continues at block 90 with the formation of a cavity 19. The cavity 19 may be formed by exposing the sacrificial material 25 (deposited at block 84) to an etchant. For example, an etchable sacrificial material such as Mo or amorphous Si may be removed by dry chemical etching by exposing the sacrificial layer 25 to a gaseous or vaporous etchant, such as vapors derived from solid $XeF_2$ for a period of time that is effective to remove the desired amount of material. The sacrificial material is typically selectively removed relative to the structures surrounding the cavity 19. Other etching methods, such as wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD display element may be referred to herein as a "released" IMOD.

In some implementations, the packaging of an EMS component or device, such as an IMOD-based display, can include a backplate (alternatively referred to as a backplane, back glass or recessed glass) which can be configured to protect the EMS components from damage (such as from mechanical interference or potentially damaging substances). The backplate also can provide structural support for a wide range of components, including but not limited to driver circuitry, processors, memory, interconnect arrays, vapor barriers, product housing, and the like. In some implementations, the use of a backplate can facilitate integration of components and thereby reduce the volume, weight, and/or manufacturing costs of a portable electronic device.

Figure 6A:
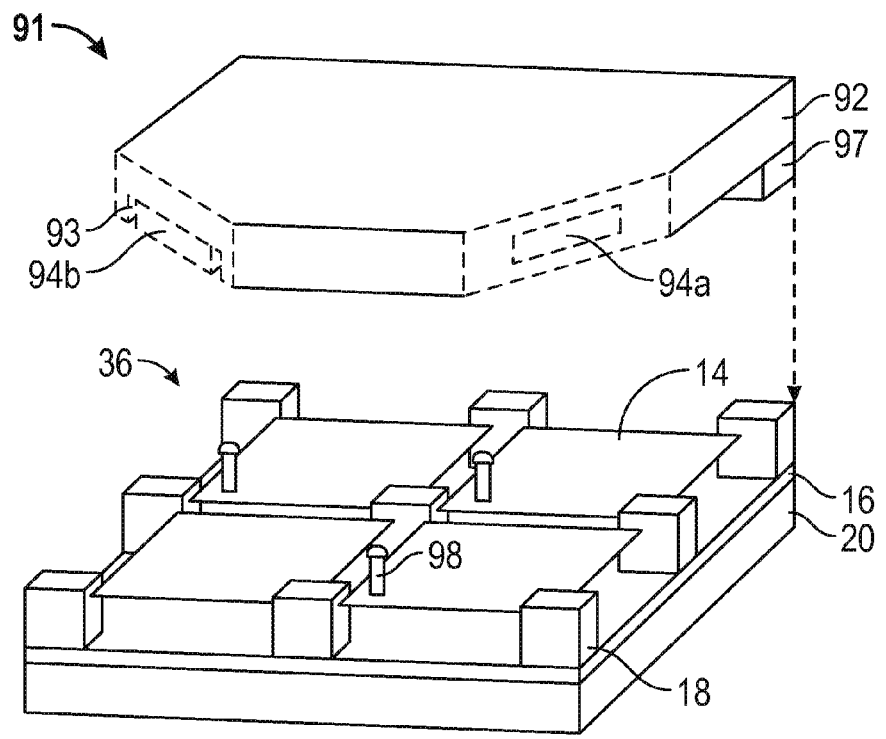
FIGS. 6A and 6B are schematic exploded partial perspective views of a portion of an electromechanical systems (EMS) package including an array of EMS elements and a backplate.
Figure 6B:
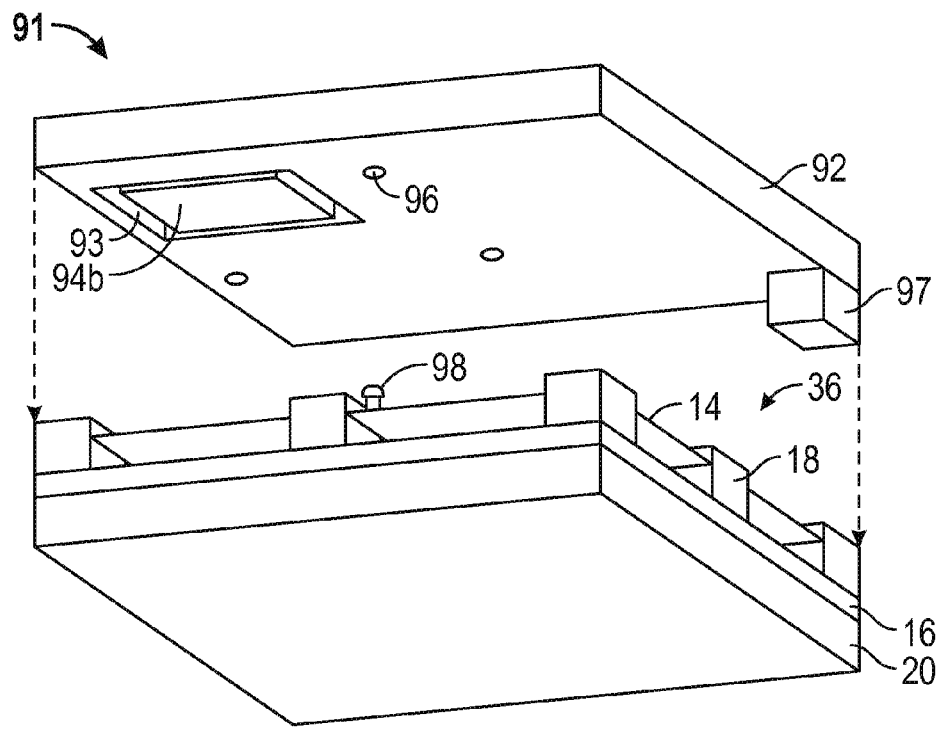

FIGS. 6A and 6B are schematic exploded partial perspective views of a portion of an EMS package 91 including an array 36 of EMS elements and a backplate 92. FIG. 6A is shown with two corners of the backplate 92 cut away to better illustrate certain portions of the backplate 92, while FIG. 6B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 6A and 6B, the backplate 92 can include one or more backplate components 94a and 94b, which can be partially or wholly embedded in the backplate 92. As can be seen in FIG. 6A, backplate component 94a is embedded in the backplate 92. As can be seen in FIGS. 6A and 6B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 6B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 6A and 6B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 6A and 6B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

FIG. 7 is a cross-sectional illustration of an example implementation of a multi-state IMOD 100. The IMOD 100 of FIG. 7 can include features similar to, or the same as, various other implementations disclosed herein, and the features discussed in connection with IMOD 100 can be incorporated into various other implementations disclosed herein. The IMOD 100 of FIG. 7 can include an optical stack 116 over a substrate 120. A movable reflector 114 can be over the optical stack 116. The movable reflector 114 can be spaced apart from the optical stack 116, and an optical cavity 119 can be between the movable reflector 114 and the optical stack 116. The optical stack 116 can include one or more layers, as discussed herein. In some implementations, the optical stack 116 can include a first electrode, and the movable reflector 114 can include a second electrode. A voltage can be applied to the first and second electrodes to produce electrostatic forces that can pull the movable reflector 114 towards the optical stack 116.

The movable reflector 114 can include a front side 110 and a back side 112. The front side 110 can face towards the optical stack 116, and the front side 110 of the movable reflector 114 can be highly reflective. The optical stack 116 can be partially reflective and partially transmissive, and light reflected from the movable reflector 114 and from the optical stack 116 can combine to produce various colors depending on the position of the movable reflector 114 and the size of the optical cavity 119. For example, the light reflected from the optical stack 116 and from the movable reflector 114 can experience constructive interference and/or destructive interference to produce an optical response with a color that depends at least partially on the size of the optical cavity 119. Various colors (e.g., red, green, blue, white, and/or black) can be produced by the IMOD 100 by positioning the movable reflector 114 at different positions (e.g., by varying the voltage applied to the electrodes).

The movable reflector 114 can be supported by one or more deformable elements 134. The deformable elements 134 can be over the movable reflector 114. The deformable elements 134 can be coupled to the back side 112 of the movable reflector 114. The deformable elements 134 can extend from a location that is above the movable reflector 114 (e.g., closer to the back side 112 than to the front side 110 of the movable reflector 114). In some implementations, the IMOD 100 can include posts 118, which can provide support to the movable reflector 114. The posts 118 can extend generally upwardly (e.g., from the substrate 120 and/or from the optical stack 116). The deformable elements 134 can extend from locations on the posts 118 that are over the movable reflector 114. The back side 112 of the movable reflector 114 can face towards the deformable elements 134. Although the posts 118 and the deformable elements 134 are shown as separate components in FIG. 7, in some implementations, the posts 118 and the deformable elements 134 can be integrated together. For example, the one or more deformable elements 134 can be one or more deformable portions of the posts 118. For example, the deformable portions of the posts 118 can be sufficiently thin to allow sufficient deformation. The posts 118 can extend generally upwardly (e.g., from the substrate 120 and/or from the optical stack 116) and can curve so that they are coupled to the back side 112 of the movable reflector 114. As discussed herein, by positioning the deformable elements 134 on the back side 112 of the movable reflector 114, the fill factor of the IMOD 100 (and of a display that uses the IMOD 100 for the display elements) can be improved.

The IMOD can include a plurality of deformable elements 134, which can be coupled to the back side 112 of the movable reflector 114 at a plurality of connecting locations. The connecting locations can be spaced away from the center of the back side 112 of the movable reflector 114, which can provide improved stability to the movable reflector 114. Spacing the connecting locations between the deformable elements 134 and the movable reflector 114 away from the center of the movable reflector can impede or prevent uneven actuation of the movable reflector 114 (e.g., where one side of the movable reflector 114 moves further than another side of the movable reflector 114). In some implementations, the distance between the connecting points of the deformable elements 134 to the movable reflector 114 is greater than the distance between one connection points and the edge of the movable reflector 114. In some implementations, the distance between the connecting locations can be greater than or equal to about 25% of the width of the movable reflector 114, greater than or equal to about 33% of the width of the movable reflector 114, greater than or equal to about 50% of the width of the movable reflector 114, less than or equal to about 90% of the width of the movable reflector 114, less than or equal to about 75% of the width of the movable reflector 114, and/or less than or equal to about 50% of the width of the movable reflector 114.

The deformable elements 134 can provide a restoring force when the movable reflector 114 is moved from the resting position shown in FIG. 7. The restoring force can bias the movable reflector 114 towards the resting or relaxed or unactuated position shown in FIG. 7. The IMOD 100 can be configured such that the deformable elements 134 provide a nonlinear restoring force. For example, the IMOD 100 can include one or more restoring force modifiers 140. The restoring force modifier 140 can be between the movable reflector 114 and the deformable element 134. The restoring force modifier 140 can extend generally horizontally from the post 118, for example, from a location on the post 118 that is over the movable reflector 114 and/or under the location where the deformable element 134 extends from the post 118. The restoring force modifier 140 is shown as a separate component from the post 118, but in some implementations, the restoring force modifier 140 can be integral with the post 118 (e.g., as a protrusion or other component extending generally horizontally from the main body of the post 118). The restoring force modifier 140 can be directly behind the movable reflector 114. For example, a line 141 that is normal to the front side 110 and/or to the back side 112 of the movable reflector 114 can intersect the restoring force modifier 140. Restoring force modifiers at other angles relative to the post 118 and/or the movable reflector 114 are also possible (e.g., angled towards the movable reflector 114 or angled away from the movable reflector 114). The angle of the restoring force modifier 140 relative to the post 118 can be about 45° to about 135° (e.g., about 80° to about 100°). The restoring force modifier 140 can be configured to increase the restoring force of a deformable element 134 when the restoring force modifier 140 is engaged (e.g., contacted by the deformable element 134).

FIG. 8 is a cross-sectional illustration of the multi-state IMOD 100 of FIG. 7 with the movable reflector 114 actuated to a contacting or first actuated position. As the movable reflector 114 is actuated towards the optical stack 116, the deformable elements 134 can be drawn toward the restoring force modifier 140 until at least one deformable element 134 comes into contact with at least one restoring force modifier 140. The contacting position of FIG. 8 can be the position at which contact is first made between the deformable element 134 and the restoring force modifier 140. FIG. 9 is a cross-sectional illustration of the multi-state IMOD of FIG. 7 with the movable reflector actuated past the contacting position or in a second actuated state. The IMOD 100 can be configured such that the restoring force modifier 140 increases the restoring force of the deformable element 134 when the deformable element 134 is in contact with the restoring force modifier (e.g., when the movable reflector 114 is actuated past the contacting position, as shown in FIG. 9). Various aspects of the IMOD 100 can contribute to the configuration that enables the restoring force modifier 140 to increase the restoring force of the deformable element 134, such as, for example, the materials, thickness, and/or shape of the deformable element 134, the materials, thickness, and/or shape of the restoring force modifier 140, the size of the restoring force modifier 140, the amount of contact area between the restoring force modifier 140 and the deformable element 134, and/or the amount of the deformable element 134 that extends inwardly past the end of the restoring force modifier 140. Also, the IMOD 100 can be configured to apply appropriate forces such that the restoring force modifier 140 increases the restoring force of the deformable element 134 when the deformable element 134 is in contact with the restoring force modifier. For example, the voltage applied to the IMOD 100 and/or the configuration of electrodes (e.g., the sizes, locations, and/or materials of the electrodes) in the IMOD 100 can be configured such that the restoring force modifier 140 increases the restoring force of the deformable element 134 when the deformable element 134 is in contact with the restoring force modifier.

The deformable elements 134 can operate as cantilever springs and can have a spring constant that changes depending on whether the deformable elements 134 are engaged with the restoring force modifiers 140. As the movable reflector 114 moves from the resting position (FIG. 7) to the contacting position (FIG. 8), the deformable elements 134 are not in contact with the restoring force modifier 140, and a first spring constant of a deformable element 134 can be at least partially defined by a first length 136 (e.g., the full deformable length of the deformable element 134). When the deformable element 134 is in contact with the restoring force modifier 140, the effective deformable length of the deformable element 134 can be shortened to a second length 138. As the movable reflector 114 is actuated past the contacting position (FIG. 9), the second length 138 deforms to provide additional restoring force at a second spring constant that is higher than the first spring constant (e.g., due to the shorter effective length of the cantilever spring). Between the resting position (FIG. 7) and the contacting position (FIG. 8), the first spring constant can be at least partially defined by both a first portion 135 of the deformable element 134 (e.g., inward from the restoring force modifier 140) and a second portion 137 of the deformable element 134 (e.g., directly over the restoring force modifier 140). As the movable reflector 114 is actuated past the contacting position (FIG. 9), the second spring constant can be at least partially defined by the first portion 135 of the deformable element 134 and not the second portion 137 of the deformable element 134.

The multi-state IMOD 100 can be configured to produce different colors at different stable positions. For example, in some implementations, the resting position (FIG. 7) can produce a first color response (e.g., red), the contacting position (FIG. 8) can producing a second color response (e.g., green), and the position shown if FIG. 9 can produce a third color response (e.g., blue). Various other colors can be produced by the positions shown in FIGS. 7-9 depending on the configuration of the IMOD 100, and various other colors can be produced at various other positions of the movable reflector 114. For example, the IMOD 100 can produce a white, broadband, or white response at the resting position or at a different position of the movable reflector. In some implementations, the IMOD 100 can produce a black or dark response, e.g., at a closed or third actuated position (not shown) where the optical cavity 119 is eliminated and the movable reflector 114 is fully actuated to contact the optical stack 116. Many variations are possible. In some implementations, the IMOD 100 can be actuated to enough stable positions to produce 3, 5, 10, 25, 50, 100, 1000, or more color responses, and in some instances the IMOD 100 can be actuated to a number of stable positions that approaches infinity, such that the IMOD 100 can be substantially continuously positionable across the stable range of motion for the IMOD 100.

Figure 10:
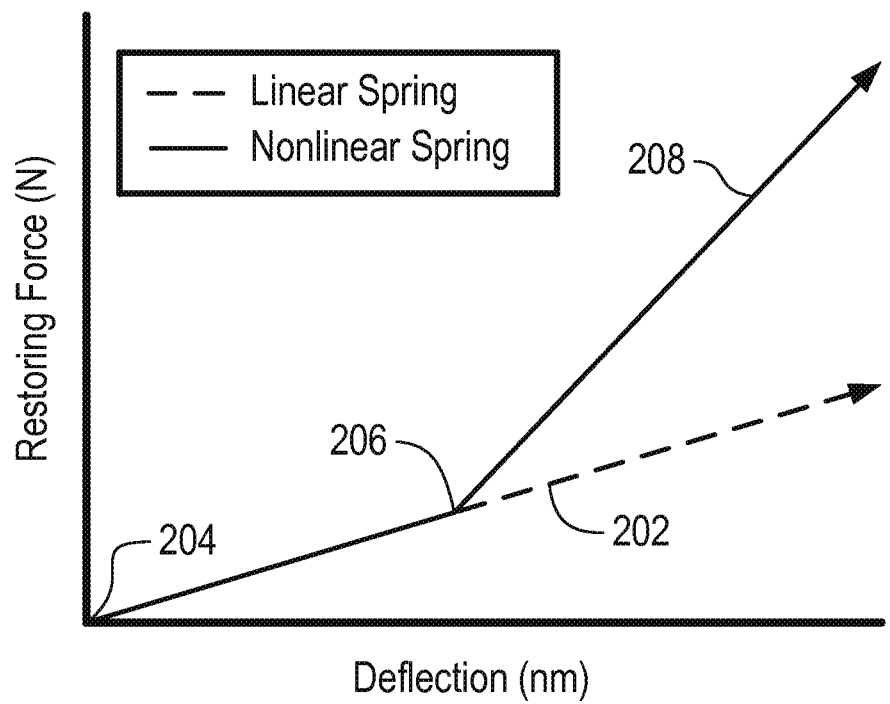
FIG. 10 is a graph showing the restoring force for an example implementation for an IMOD with a linear spring and for an example implementation for an IMOD with a nonlinear spring.

FIG. 10 is a graph showing the restoring force for an example implementation for an IMOD with a linear spring and for an example implementation for an IMOD with a nonlinear spring. Line 202 illustrates the linear restoring force for an IMOD that does not include a restoring force modifier 140. As the movable reflector 114 is deflected away from the resting position 204, the restoring force provided by the one or more deformable elements 134 can increase linearly. As the electrode of the movable reflector 114 is drawn closer to the corresponding electrode (e.g., in the optical stack 116), the electrostatic force can increase nonlinearly (e.g., exponentially). As the movable reflector 114 is deflected, it reaches a position of instability where the linear restoring force is not able to counteract the electrostatic force, and the movable reflector 114 can actuate to the closed position. The nonlinear spring illustrated in FIG. 10 can provide more restoring force than the linear spring for positions where the restoring force modifier 140 is engaged, thereby extending the stable range of motion so that the movable reflector 114 can be positioned at stable positions that would be unstable for the linear spring implementation. In FIG. 10, location 204 can correspond to the resting position of FIG. 7, location 206 can correspond to the contacting position of FIG. 8, and location 208 can correspond to the amount of movable reflector deflection shown in FIG. 9.

Figure 11:
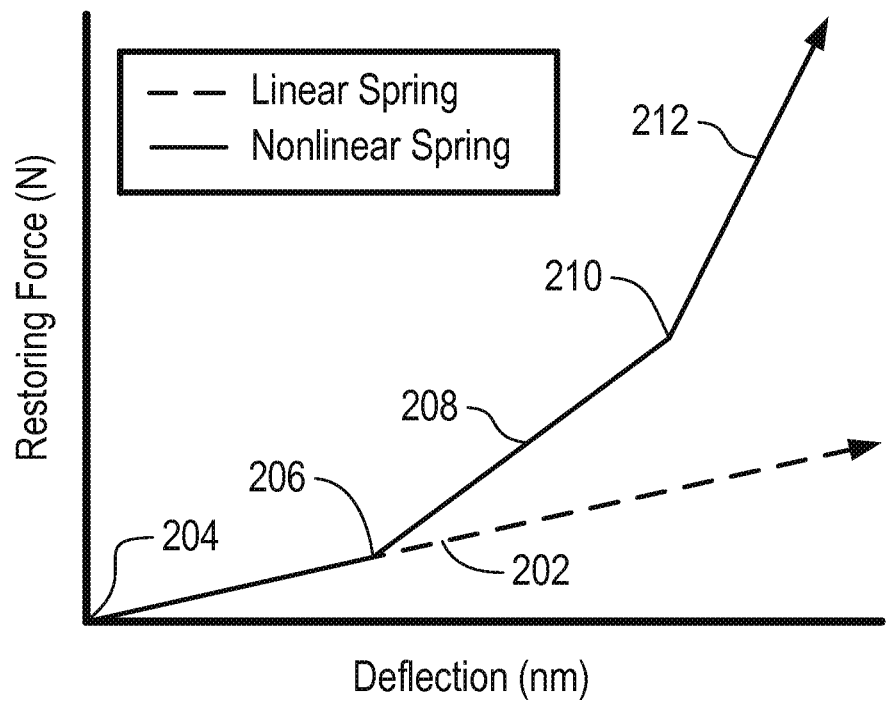
FIG. 11 is a graph showing the restoring force for another example implementation for an IMOD with a linear spring and for another example implementation for an IMOD with a nonlinear spring that has multiple nonlinearities.
Figure 12:
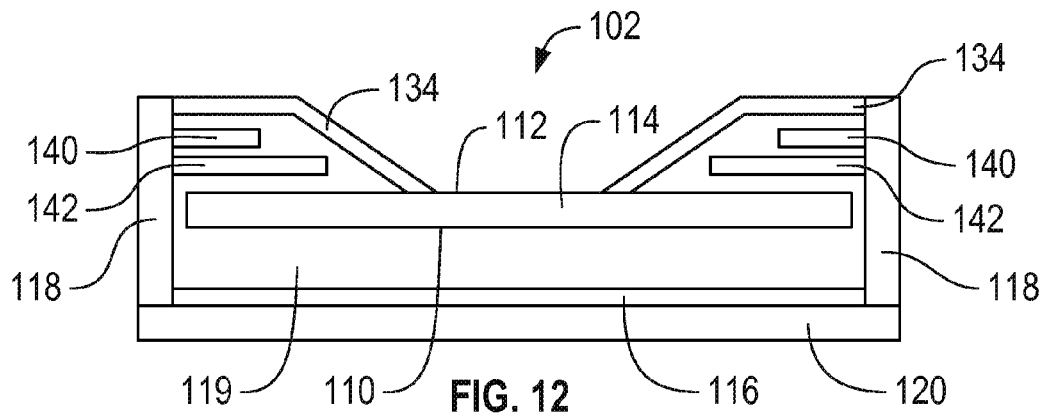
FIG. 12 is a cross-sectional illustration of an example implementation of a multi-state IMOD that has a nonlinear spring with multiple nonlinearities.

Many variations are possible. For example, in some implementations, the restoring force can include multiple nonlinearities. For example, FIG. 11 is a graph showing the restoring force for another example implementation for an IMOD with a linear spring and for an example implementation for an IMOD with a nonlinear spring that has multiple nonlinearities. FIG. 12 is a cross-sectional illustration of an example implementation of a multi-state IMOD 102 that has a nonlinear spring with multiple nonlinearities. The IMOD 102 of FIG. 12 can include features similar to, or the same as, various other implementations disclosed herein, and the features discussed in connection with IMOD 102 can be incorporated into various other implementations disclosed herein. The IMOD 102 can include restoring force modifiers 140 similar to those discussed in connection with FIGS. 7-9. The IMOD 102 can include second restoring force modifiers 142, which can be configured to further modify (e.g., increase) the restoring force of the deformable elements 134 when the movable reflector 114 is actuated to a second contacting position where the deformable elements 134 are in contact with the second restoring force modifiers 142.

With reference to FIG. 11, the movable reflector 114 can be deflected from a resting position 204 to a first contact position 206. At the first contacting position 206, the deformable elements 134 can make contact with the restoring force modifier 140, which can increase the spring constant and the restoring force, as discussed herein. At the position 208, the movable reflector 114 can be deflected to a stable position that is past the contacting position 206. When the movable reflector 114 reaches the second contacting position 210, the one or more deformable elements 134 can make contact with the second restoring force modifiers 142. The second restoring force modifiers 142 can be configured to modify the restoring force in a manner similar to the discussion herein relating the restoring force modifiers 140. For example, the contact with the second restoring force modifiers 142 can shorten the effective deformable length of the deformable elements 134, which can increase the spring constant thereof. By including the second restoring force modifiers 142, the stable range of motion can be extended further for the movable reflector 114, which can make additional stable optical responses available for the IMOD 102. For example, the movable reflector 114 can be actuated to position 212, which is past the second contacting position 210, and which can have a sufficient restoring force to counteract the electrostatic force to maintain the movable reflector 114 stable.

Additional restoring force modifiers can be added, e.g., to make an IMOD that include 3, 4, 5, or more nonlinearities in the restoring force as the deformable elements 134 contact the various restoring force modifiers. Although FIG. 12 shows the second restoring force modifiers 142 and the restoring force modifiers 140 as separate elements, they can be incorporated into a single element. For example a protrusion can have a stepped shape that includes 1, 2, 3, or more steps to produce additional restoring force modifiers. At least one parameter of the second restoring force modifiers 142 can be different than that parameter of the restoring force modifiers 140 (e.g., length, distance from the deformable elements 134, angle relative to the posts 118, thickness, material, etc.). In the implementation illustrated in FIG. 12, the length and the distance from the deformable elements 134 is different.

Figure 13:
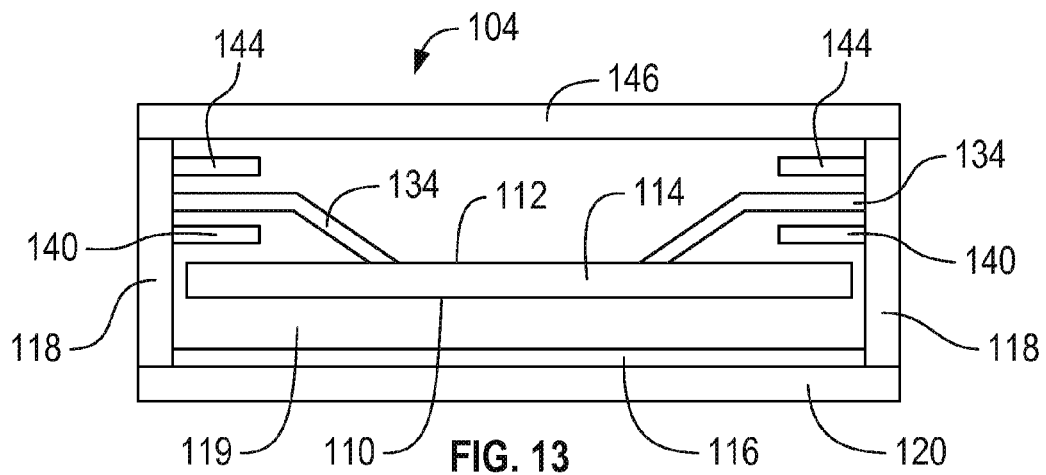
FIG. 13 is a cross-sectional illustration of another example implementation of a multi-state IMOD.

FIG. 13 is a cross-sectional illustration of another example implementation of a multi-state IMOD 104. The IMOD 104 of FIG. 13 can include features similar to, or the same as, various other implementations disclosed herein, and the features discussed in connection with IMOD 104 can be incorporated into various other implementations disclosed herein. In some implementations, the IMOD 104 can be configured to actuate the movable reflector 114 in a first direction (e.g., toward the optical stack 116) and in a second direction (e.g., away from the optical stack 116). For example, the IMOD 104 can include a third electrode (e.g., in a cap 146 that is above the movable reflector 114 and above the deformable elements 134). The third electrode can be configured to interact with the second electrode that is in the movable reflector 114 (discussed above), or the movable reflector 114 can include an additional electrode that is configured to interact with the third electrode to move the movable reflector 114. By actuating the movable reflector 114 both downward (e.g., towards the optical stack 116) and upward (e.g., away from the optical stack 116), additional optical responses can be selected.

In some implementations, the IMOD 104 can include additional restoring force modifiers 144, which can function in a manner similar to the restoring force modifiers 140 discussed herein, except that the restoring force modifiers 144 can increase the restoring force as the movable reflector 114 is actuated upward (e.g., away from the optical stack 116). Many variations are possible. The additional restoring force modifiers 144 can be the same as the restoring force modifiers 140, or at least one parameter of the restoring force modifiers 144 can be different than that parameter of the restoring force modifiers 140 (e.g., length, distance from the deformable elements 134, angle relative to the posts 118, thickness, material, etc.). In some implementations, the restoring force modifiers 140 can be omitted from the IMOD 104. In some implementations, the cap 146 can be used as the additional restoring force modifier 140. For example, the cap 146 can be positioned such that the deformable elements 134 abut against the underside of the cap 146 when the movable reflector 114 is actuated upward to an upward contact position. The contact between the deformable elements 134 and the cap 146 can increase the restoring force in a manner similar to the discussion above. Although shown extending from the posts 118 in FIG. 13, the restoring force modifiers 144 may protrude downwardly from the cap 146.

Figure 14:
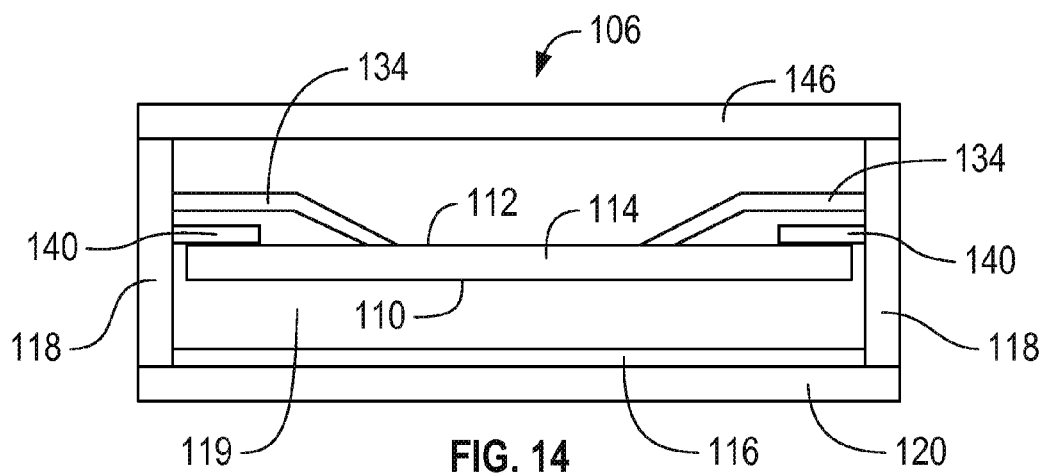
FIG. 14 is a cross-sectional illustration of another example implementation of a multi-state IMOD.

FIG. 14 is a cross-sectional illustration of another example implementation of a multi-state IMOD 106. The IMOD 106 of FIG. 14 can include features similar to, or the same as, various other implementations disclosed herein, and the features discussed in connection with IMOD 106 can be incorporated into various other implementations disclosed herein. In some implementations, the movable reflector 114 can contact the one or more restoring force modifiers 140 when the movable reflector 114 is actuated upwardly to an upward contact position (shown in FIG. 14), for example by applying a voltage between the electrode of the movable reflector 114 and the electrode of the cap 146 or by applying a voltage between an electrode in the deformable elements 134 and the electrode of the cap 146. In some cases, the restoring force modifiers 140 can provide a stop for the movable reflector 114, and can impede or prevent the movable reflector 114 from actuating past the upward contact position of FIG. 14.

Figure 15:
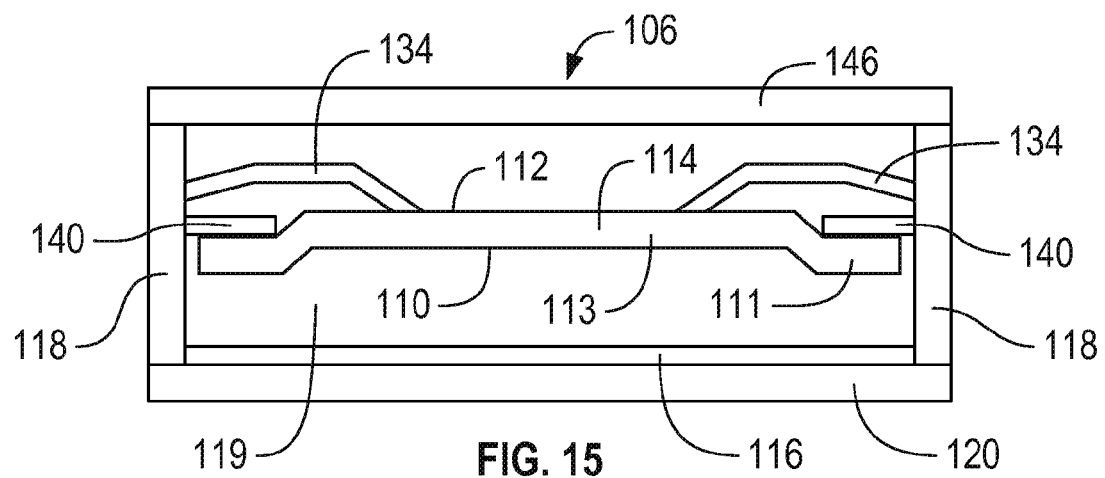
FIG. 15 is a cross-sectional illustration of the IMOD of FIG. 14, with a flexible movable reflector.

In some implementations, the movable reflector 114 can be flexible. FIG. 15 is a cross-sectional illustration of the IMOD 106 of FIG. 14, with a flexible movable reflector 114. The movable reflector 114 can include one or more first portions (e.g., lateral portions 111) that can be configured to contact the one or more restoring force modifiers 140 when the movable reflector 114 is in the upward contact position. A second portion (e.g., a central portion 113) of the movable reflector 114 can be actuated past the upward contact position (e.g., as shown in FIG. 15), which can cause the movable reflector 114 to flex or deform. For example, the lateral portions 111 can remain at the upward contact position, while the central portion 113 can extend upward past the upward contact position. When moving from the resting position to the upward contact position, the restoring force can be at least partially defined by the deformable elements 134 (e.g., the full deformable lengths thereof) which can function as cantilever spring. When the central portion 113 of the movable reflector 114 is actuated past the upward contact position, the restoring force can be at least partially defined by the deformable elements 134 (e.g., the full deformable lengths thereof) and also the deformation of the movable reflector 114 itself. When the movable reflector 114 is deformed (FIG. 15), the movable reflector 114 can exert a restoring force that biases the movable reflector back toward the undeformed position (FIG. 14). The IMOD 106 can have a nonlinear restoring force when the movable reflector 114 is actuated in the upward and/or downward directions.

In some implementations, the IMOD 106 can have a dual optical response when the movable reflector 114 is in the deformed position (FIG. 15). For example, when the movable reflector 114 is deformed, the cavity height can be larger for the central portion 113 than for the lateral portions 111 of the movable reflector 114. The central portion 113 can be configured to output a first color and the lateral portions 111 can be configured to output a second color that is different from the first color. In some implementations, the two colors can mix to create an effective hybrid color for the IMOD 106. For example, the lateral portions 111 can produce red and the central portion 113 can produce green, which can be spatially mixed by the human visual system to appear yellow. Such mixing of the colors produced by the different portions of the movable reflector 114 can provide additional color choices for the IMOD display elements.

Figure 16:
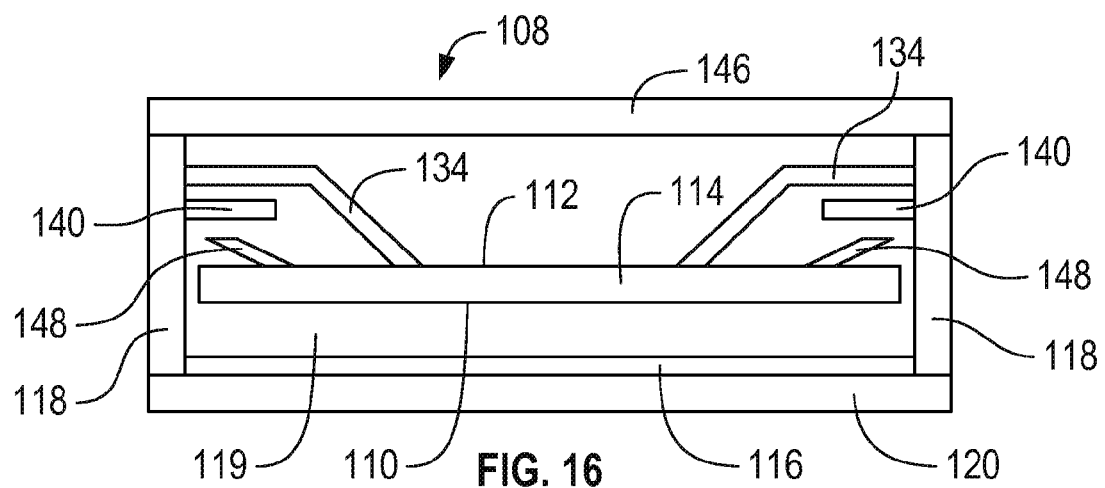
FIG. 16 is a cross-sectional illustration of another example implementation of a multi-state IMOD.

FIG. 16 is a cross-sectional illustration of another example implementation of a multi-state IMOD 108. The IMOD 108 of FIG. 16 can include features similar to, or the same as, various other implementations disclosed herein, and the features discussed in connection with IMOD 108 can be incorporated into various other implementations disclosed herein. The IMOD 108 can include one or more flexible elements 148, which can be configured to provide a nonlinear restoring force when the movable reflector 114 is actuated in an upward direction. The flexible elements 148 can be positioned between the movable reflector 114 and the restoring force modifiers 140. For example, the flexible elements 148 can be coupled to the back side 112 of the movable reflector 114 (e.g., at lateral portions thereof). Although not shown in FIG. 16, in some implementations, the flexible elements 148 can also or alternatively be coupled to the restoring force modifiers 140 (e.g., to an underside thereof). Although FIG. 16 shows the flexible elements 148 as distinct elements from the movable reflector 114 and the restoring force modifiers 140, in some implementations, the flexible elements 148 can be integral with the movable reflector 114 or the restoring force modifiers 140. For example, the flexible elements 148 can be flexible portions of the movable reflector 114 or of the restoring force modifiers 140.

Figure 17:
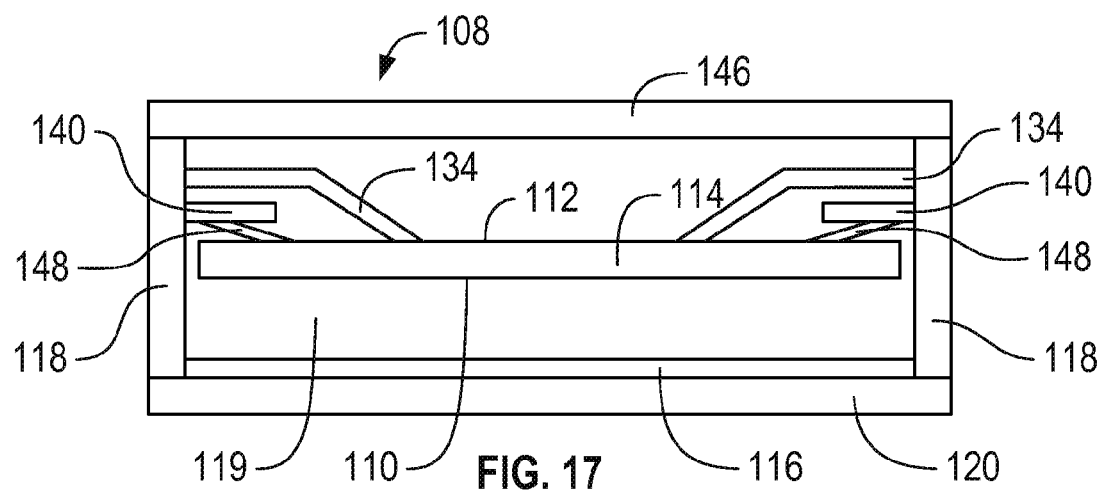
FIG. 17 is a cross-sectional illustration of the IMOD of FIG. 16 in an actuated position.

FIG. 16 shows the movable reflector 114 at a resting position. FIG. 17 is a cross-sectional illustration of the IMOD 108 of FIG. 16 in an actuated position. In FIG. 17, the flexible elements 148 are partially compressed, which can increase the restoring force similar to other implementations discussed herein. As the movable reflector 114 moves from the resting position to an upward contacting position (where the flexible elements 148 are in contact with both the movable reflector 114 and the restoring force modifiers 140, for example by applying a voltage between the electrode of the movable reflector 114 and the electrode of the cap 146 or by applying a voltage between an electrode in the deformable elements 134 and the electrode of the cap 146), the restoring force can be at least partially defined by the deformable elements 134 (e.g., the full deformable lengths thereof) which can function as cantilever springs, as discussed above. When the movable reflector 114 is actuated upward past the upward contacting position, the flexible elements 148 can be compressed between the movable reflector 114 and the restoring force modifiers 140, which can result in additional restoring force that biases the movable reflector 114 toward resting or unactuated position. The IMOD 108 can have a nonlinear restoring force when it is actuated in the upward direction, which can increase the stable range of motion of the movable reflector 114 in the upward direction, similar to other implementations discussed herein.

Combinations of two or more of the restoring force modifiers described herein are also possible. For example, an IMOD may include two or more of the restoring force modifiers 140, 142, and 144, the flexible movable reflector 114, and the flexible elements 148 (e.g., the restoring force modifiers 140 and 142 (e.g., as shown in FIG. 12), alone or in combination with a flexible movable reflector 114 and/or flexible elements 148; the restoring force modifiers 140 and 144 (e.g., as shown in FIG. 13), alone or in combination with a flexible movable reflector 114 and/or flexible elements 148; the restoring force modifiers 140, 142, and 144, alone or in combination with a flexible movable reflector 114 and/or flexible elements 148; etc.). Additional restoring force modifiers can increase the number of stable positions of the IMOD, but may add manufacturing complexity.

Figure 18:
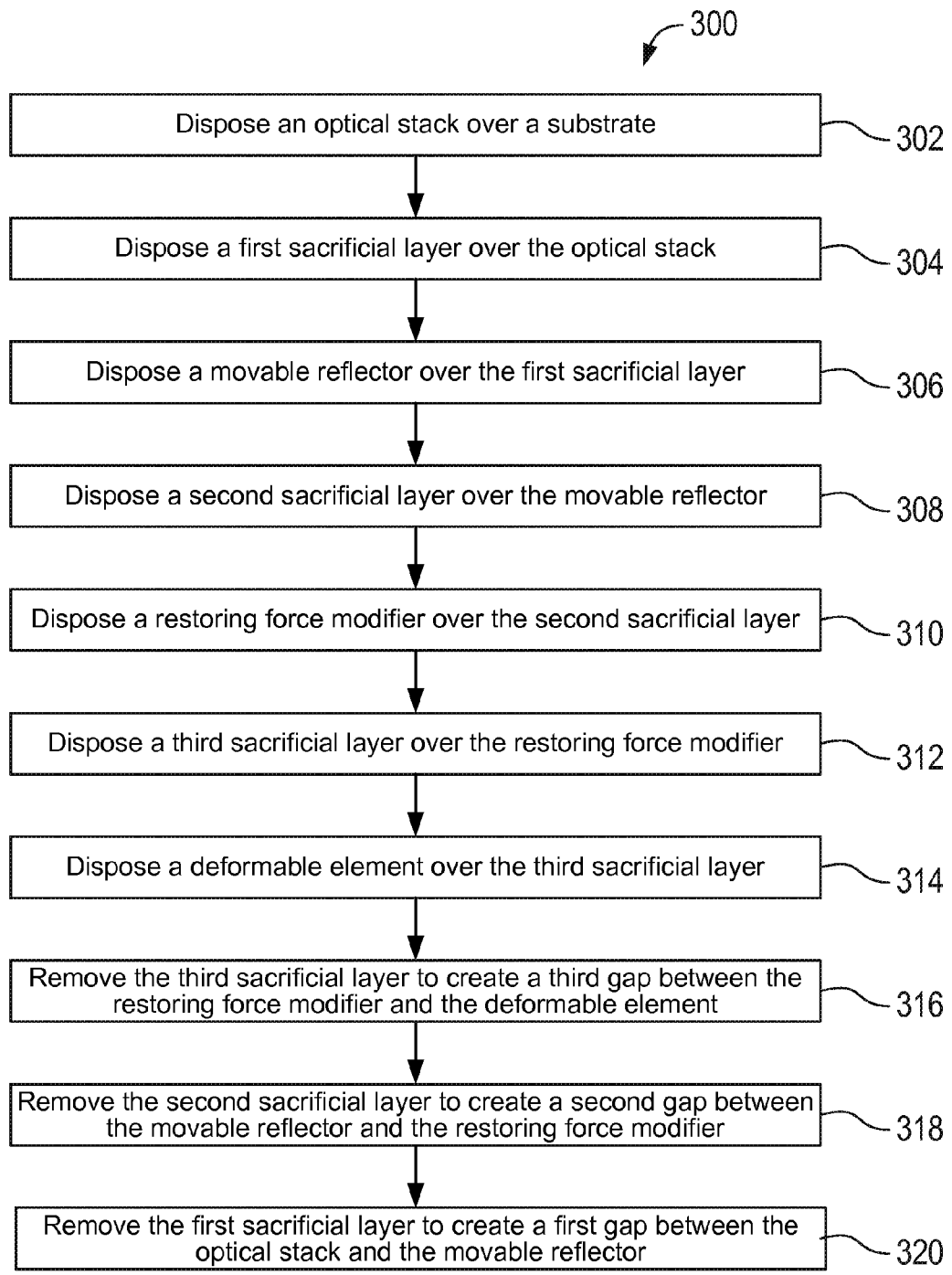
FIG. 18 a flow diagram illustrating an example implementation of a manufacturing process for a multi-state IMOD.
Figure 19A:
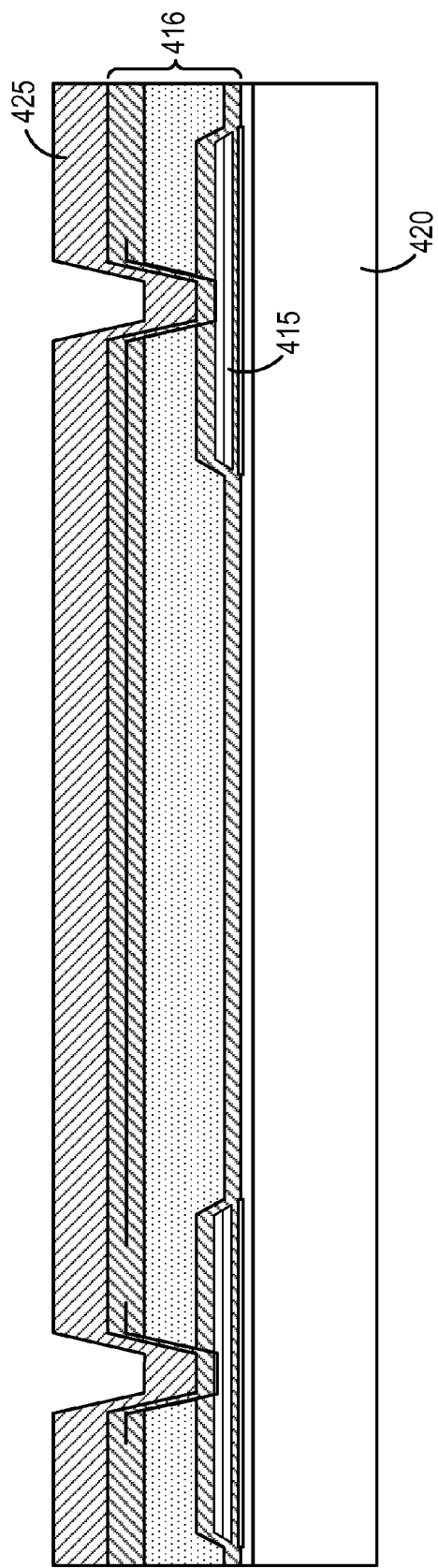
FIGS. 19A-19K are cross-sectional illustrations of various stages in a process of making a multi-state IMOD.

FIG. 18 a flow diagram illustrating an example implementation of a manufacturing process 300 for a multi-state IMOD. FIGS. 19A-19K are cross-sectional illustrations of various stages in the process 300 for making a multi-state IMOD 400 (FIG. 19K). The method 300 and the IMOD 400 can include features similar to, or the same as, various other implementations disclosed herein, and the features discussed in connection with the method 300 and the IMOD 400 can be incorporated into various other implementations disclosed herein. The manufacturing process 300 can include additional blocks not shown in FIG. 18 and additional features not specifically discussed herein. Many block and features of the process 300 can be similar to, or the same as, the block and features described in connection with FIG. 4. Accordingly, many of the features described in connection with FIG. 4 are not repeated in the discussion of the process 300.

The process 300 can begin at block 302 with the formation of an optical stack 416 over a substrate 420. FIG. 19A shows an example of an optical stack 416 formed over a substrate 420. The substrate 420 may be a transparent substrate such as glass or plastic such as the materials discussed above with respect to FIG. 1. The substrate 420 may be flexible or relatively stiff and unbending, and may have been subjected to prior preparation processes, such as cleaning, to facilitate efficient formation of the optical stack 416. As discussed above, the optical stack 416 can be electrically conductive, partially transparent, partially reflective, and partially absorptive, and may be fabricated, for example, by depositing one or more layers having the desired properties onto the transparent substrate 420.

In some implementations, a black matrix 415 can be over portions of the substrate 420 (e.g., prior to forming the optical stack 416). FIG. 19A shows an example black matrix 415 over the substrate 420. The black matrix 415 can include a multilayer structure. For example, the black matrix 415 can include an aluminum oxide or alumina ($Al_2O_3$) layer (which can have a thickness of about 60 Angstroms to about 100 Angstroms, or about 80 Angstroms), which in some cases can extend over the viewing area of the IMOD 400. The black matrix 415 can also include a molybdenum chromium (MoCr) layer (which can have a thickness of about 40 Angstroms to about 60 Angstroms, or about 50 Angstroms), a silicon dioxide ($SiO_2$) layer (which can have a thickness of about 500 Angstroms to about 1000 angstroms, or about 750 Angstroms), and an aluminum copper (AlCu) layer (which can have a thickness of about 400 Angstroms to about 600 Angstroms, or about 500 Angstroms). Many variations are possible for the various example materials and thicknesses described herein. For example, the thickness of the $SiO_2$ layer of the black matrix 415 can depend on the optical constants (e.g., n (refractive index) and k (extinction coefficient)) of the $SiO_2$ layer and/or the partial reflector layer (MoCr), and can also depend on the thickness of the partial reflector layer (MoCr). Other materials, such as chromium (Cr), vanadium (V), germanium (Ge), etc., can be used for the partial reflector layer instead of MoCr. The thickness of both the $SiO_2$ layer and the partial reflector layer can depend on the optical constants of the partial reflector layer and the $SiO_2$ layer. In some implementations, the AlCu layer can have a thickness of about 3000 Angstroms to about 5000 Angstroms, which can provide improved electrical conductance, and a planar layer (e.g., spin on glass (SOG)) having a thickness between about 1 micron and about 2 microns can be disposed over the AlCu layer. In some implementations, the AlCu layer can have a thickness between about 300 Angstroms and about 1000 Angstroms, such as if the planar layer (e.g., SOG) is omitted. The MoCr, $SiO_2$, and AlCu layers can be etched away to at least partially define the viewable area of the IMOD 400.

In FIG. 19A, the optical stack 416 includes a multilayer structure having sub-layers as discussed below, although more or fewer sub-layers may be included in some other implementations. In some implementations, one of the sub-layers can be configured with both optically absorptive and electrically conductive properties, such as a combined conductor/absorber sub-layer. In some implementations, one of the sub-layers and can include molybdenum-chromium (molychrome or MoCr), or other materials with a suitable complex refractive index. One or more of the sub-layers and can be patterned into parallel strips, and may form row electrodes in a display device. Such patterning can be performed by a masking and etching process or another suitable process known in the art. In some implementations, one of the sub-layers can be an insulating or dielectric layer, such as an upper sub-layer that is deposited over one or more underlying metal and/or oxide layers (such as one or more reflective and/or conductive layers). The optical stack 416 can be patterned into individual and parallel strips that form the rows of the display. In some implementations, at least one of the sub-layers of the optical stack, such as the optically absorptive layer, may be quite thin (e.g., relative to other layers depicted in this disclosure).

The optical stack can include, for example, an $SiO_2$ layer (which can have a thickness of about 750 Angstroms to about 1250 Angstroms, about 300 Angstroms to about 3000 Angstroms, or about 1000 Angstroms), a spin-on glass (SOG) layer (which can have a thickness of about 4000 Angstroms to about 6000 Angstroms, or about 5000 Angstroms, or about 1 micron to about 2 microns), and another $SiO_2$ layer (which can have a thickness of about 750 Angstroms to about 1250 Angstroms, about 300 Angstroms to about 3000 Angstroms, or about 1000 Angstroms). These layers can planarize the layers below (e.g., the black matrix 415). The $SiO_2$ layers can provide a buffer between the SOG layer and the surrounding layers. The optical stack 416 can include an electrode (which can be an electrically conductive material, such as a metal). A chromium (Cr) layer (which can have a thickness of about 40 Angstroms to about 60 Angstroms, or about 50 Angstroms) can be used as the electrode, and a $SiO_2$ layer (which can have a thickness of about 75 Angstroms to about 125 Angstroms, or about 100 Angstroms) can be over the electrode layer (e.g., Cr).

The process 300 continues at block 304 with the formation of a sacrificial layer 425 over the optical stack 416. Because the sacrificial layer 425 is later removed (see block 316) to form the cavity 419, the sacrificial layer 425 is not shown in the resulting IMOD 400 in FIG. 19K. FIG. 19A illustrates a partially fabricated device including a sacrificial layer 425 formed over the optical stack 416. The formation of the sacrificial layer 425 over the optical stack 416 may include deposition of a xenon difluoride ($XeF_2$)-etchable material such as molybdenum (Mo) or amorphous silicon ($\alpha$-Si), in a thickness selected to provide, after subsequent removal, a gap or cavity 419 (see also FIG. 19K) having a desired design size, although launching and other factors may also contribute to the size of the cavity 419. The thickness of the sacrificial layer 425 can be, for example, about 2600 Angstroms to about 4600 angstroms, or about 3600 Angstroms. Deposition of the sacrificial material, and various other layer described herein, may be carried out using deposition techniques such as physical vapor deposition (PVD, which includes many different techniques, such as sputtering), plasma-enhanced chemical vapor deposition (PECVD), thermal chemical vapor deposition (thermal CVD), a spin-coat process, a slit coat process, a spray coat process, or a roller coat process.

The process 300 continues at block 306 with the formation of a movable reflector 414. The movable reflector 414 may be formed by employing one or more deposition steps, including, for example, reflective layer (such as aluminum, aluminum alloy, or other reflective materials) deposition, along with one or more patterning, masking and/or etching steps. The movable reflector 414 can include one or more layers that can be patterned into individual and parallel strips that form, for example, the columns of the display. The movable reflector 414 can include an electrically conductive layer. In some implementations, the movable reflector 414 may include a plurality of sub-layers. In some implementations, one or more of the sub-layers may include highly reflective sub-layers selected for their optical properties, and another sub-layer may include a mechanical sub-layer selected for its mechanical properties (e.g., a support or stiffener sub-layer). In some implementations, the mechanical sub-layer may include a dielectric material.

Figure 19B:
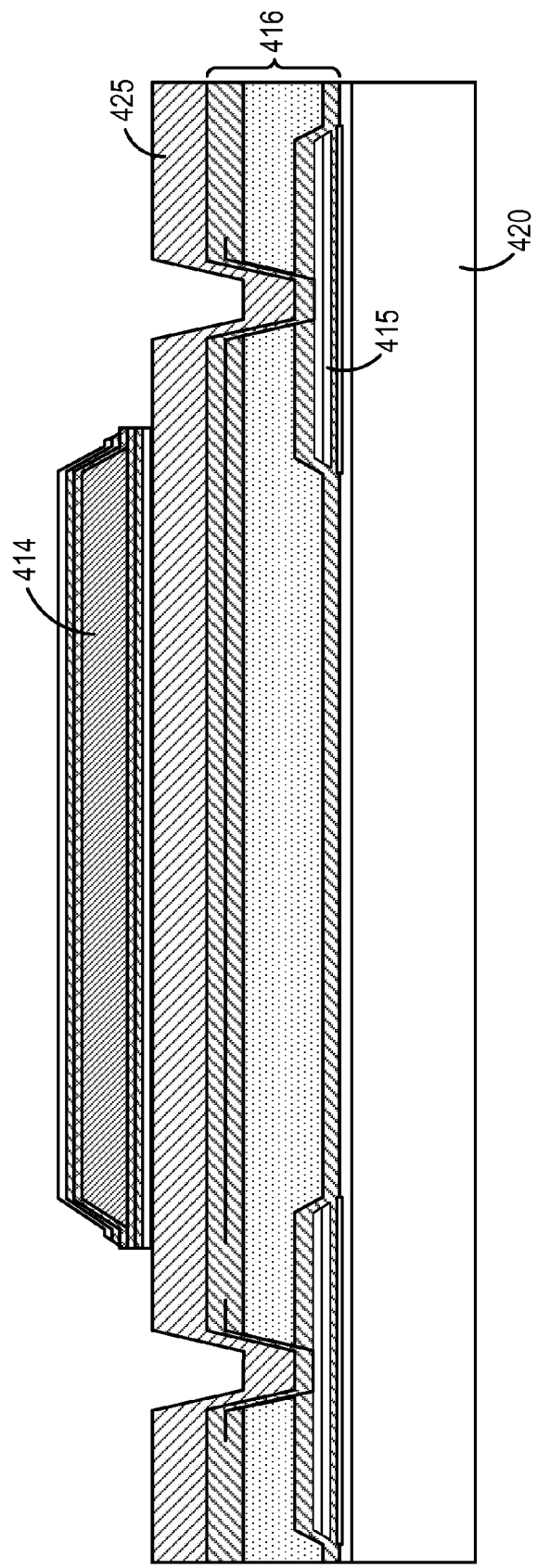

FIG. 19B shows a movable reflector 414 over the sacrificial layer 425. The movable reflector 414 can include a titanium oxide ($TiO_2$) layer (which can be about 200 Angstroms to about 400 Angstroms, or about 300 Angstroms), a $SiO_2$ layer (which can be about 400 Angstroms to about 800 Angstroms, or about 600 Angstroms), and an electrically conductive layer that can be an AlCu layer (which can have a thickness of about 200 Angstroms to about 400 Angstroms, about 200 Angstroms to about 500 Angstroms, or about 300 Angstroms). In some implementations, the electrically conductive layer (e.g., the AlCu layer) can also be highly reflective. Over those layer, the movable reflector 414 can include a structural layer (e.g., a stiffener layer) that can be a silicon-oxynitride (SiON) layer (which can have a thickness of about 7500 Angstroms to about 12,500 Angstroms, about 5000 Angstroms to about 15,000 Angstroms, or about 10,000 Angstroms), another electrically conductive layer, e.g., a another electrically conductive layer that can be a AlCu layer (which can have a thickness of about 200 Angstroms to about 400 Angstroms, about 200 Angstroms to about 500 Angstroms, or about 300 Angstroms), another $SiO_2$ layer (which can be about 400 Angstroms to about 800 Angstroms, or about 600 Angstroms), and another $TiO_2$ layer (which can be about 200 Angstroms to about 400 Angstroms, or about 300 Angstroms).

The conductive layers (e.g., AlCu) that can be on opposing sides of the stiffener layer, and the conductive layers can contact each other (e.g., at the sides of the movable reflector 414) or can otherwise be in electrical communication with each other. In some implementations, electrical charge received by the back of the movable reflector 414 can be relayed to the front of the movable reflector 414 via the electrical connection between the conductive layers on either side of the stiffener layer. Many variations are possible. In some implementations, the electrode is not on the front side of the movable reflector 414 (e.g., below the stiffener layer). For example, the electrode on the movable reflector 414 can be on the back of the movable reflector 414 (e.g., over the stiffener layer), and the electrostatic forces can pass through the stiffener layer of the movable reflector 414 to actuate the movable reflector 414 during operation.

Figure 19C:
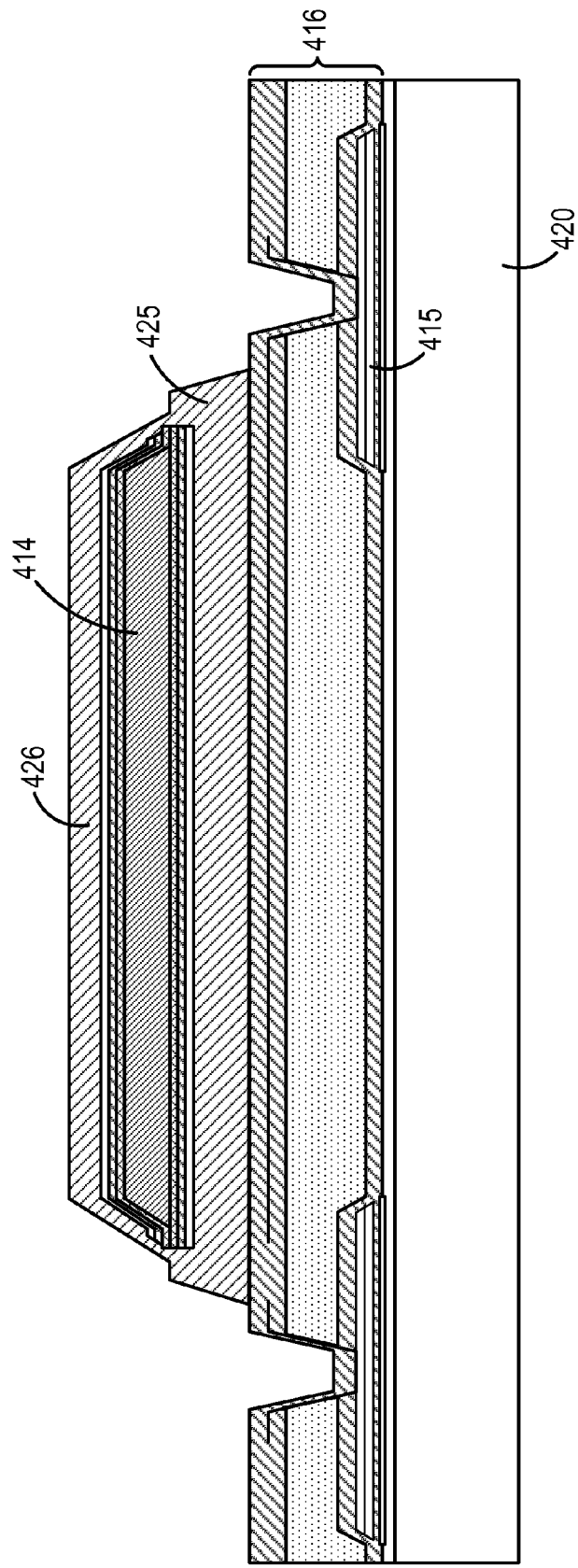

The process 300 can proceed to block 308 with the formation of a second sacrificial layer 426 over the movable reflector 414. FIG. 19C shows a second sacrificial layer 426 over the movable reflector 414 after patterning. The second sacrificial layer 426 can be formed of similar materials and using similar processes to the first sacrificial layer 425, or at least one parameter of the second sacrificial layer 426 can be different than that parameter of the first sacrificial layer 425 (e.g., thickness, material, planarity, etc.). The second sacrificial layer 426 can have a suitable thickness for forming a gap between the movable reflector 414 and the restoring force modifier 440, as discussed below. The second sacrificial layer can be, for example, amorphous silicon ($\alpha$-Si) and can have a thickness of about 2600 Angstroms to about 4600 Angstroms, about 1000 Angstroms to about 5000 Angstroms, or about 3600 Angstroms.

Figure 19D:
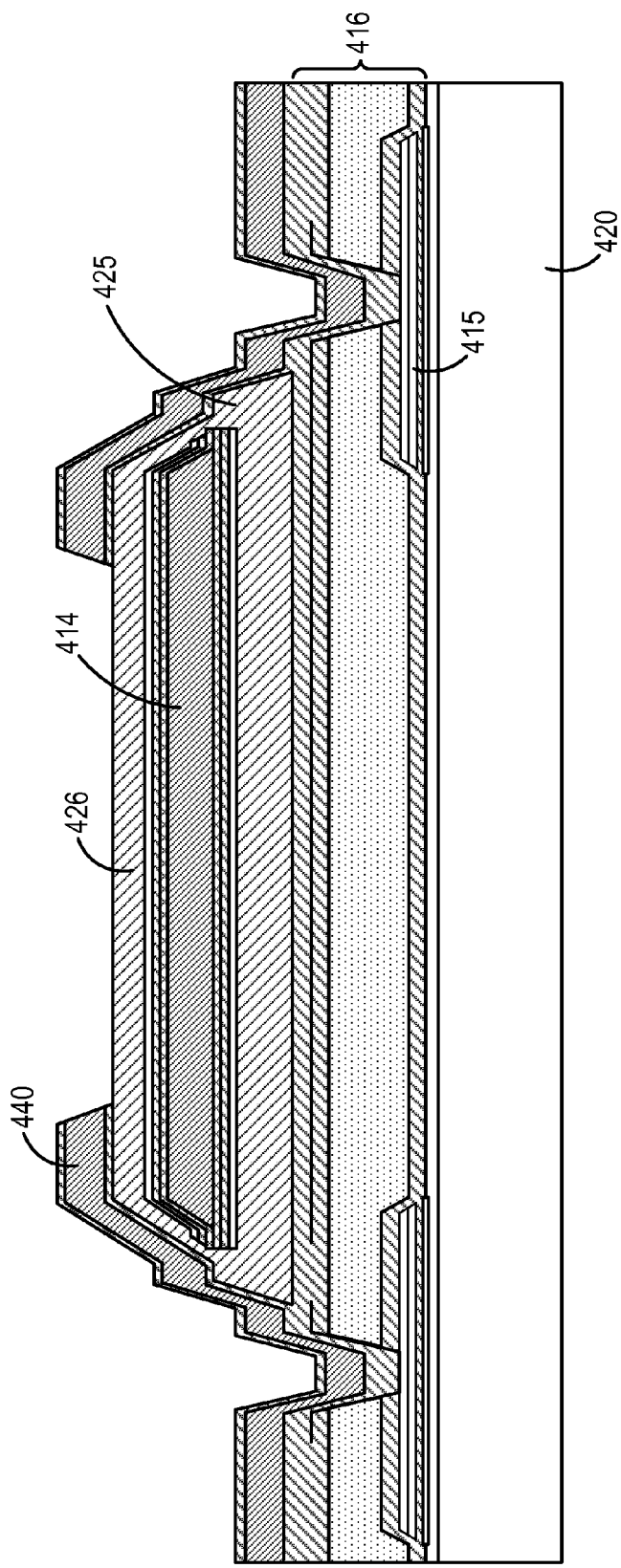

The process 300 can proceed to block 310 with the forming of the restoring force modifier 440 over the second sacrificial layer 426. FIG. 19D shows restoring force modifiers 440 over the second sacrificial layer 426. The restoring force modifier 440 can include a stiffener layer, which can have buffer layers on one, or both, sides thereof. For example, the restoring force modifier 440 can include an $SiO_2$ layer (which can have a thickness of about 150 Angstroms to about 350 Angstroms, or about 250 Angstroms), a stiffener layer that can include SiON and/or that can have a thickness of about 4000 Angstroms to about 6000 Angstroms, or about 5000 Angstroms, and another $SiO_2$ layer (which can have a thickness of about 150 Angstroms to about 350 Angstroms, or about 250 Angstroms). SiON can be used for the stiffener layer because its stress resistance (e.g., for tensile and compressive stress) can be tuned across a wide range. The $SiO_2$ layers can protect the stiffening layer (e.g., SiON). For example, $SiO_2$ can have better resistance to an etchant material (e.g., $XeF_2$) than SiON, so the $SiO_2$ material can be disposed over, under, around, etc. the SiON material to protect the SiON material (e.g., from $XeF_2$ or other etchant material). In some implementations, the restoring force modifier 440 can be substantially rigid. For example, the restoring force modifier 440 can be sufficiently rigid that, during normal operation, the restoring force modifier 440 does not flex or bend in a manner that affects operation of the IMOD 400. When the deformable elements 434, the movable reflector 414, and/or other features of the IMOD 400 press against the restoring force modifier 440, any flexing or bending of the restoring force modifier 440 can be small enough that it does not change the color of light output by the IMOD 400. Many variations are possible. In some implementations, the restoring force modifier 440 can be made to be flexible, such that the restoring force modifier 440 can resiliently bend when the deformable elements 434, the movable reflector 414, and/or other features of the IMOD 400 press against the restoring force modifier 440. The bending of the restoring force modifier 440 can, in some implementations, increase the restoring force (e.g., that biases the movable reflector 414 toward the resting position).

Figure 19E:
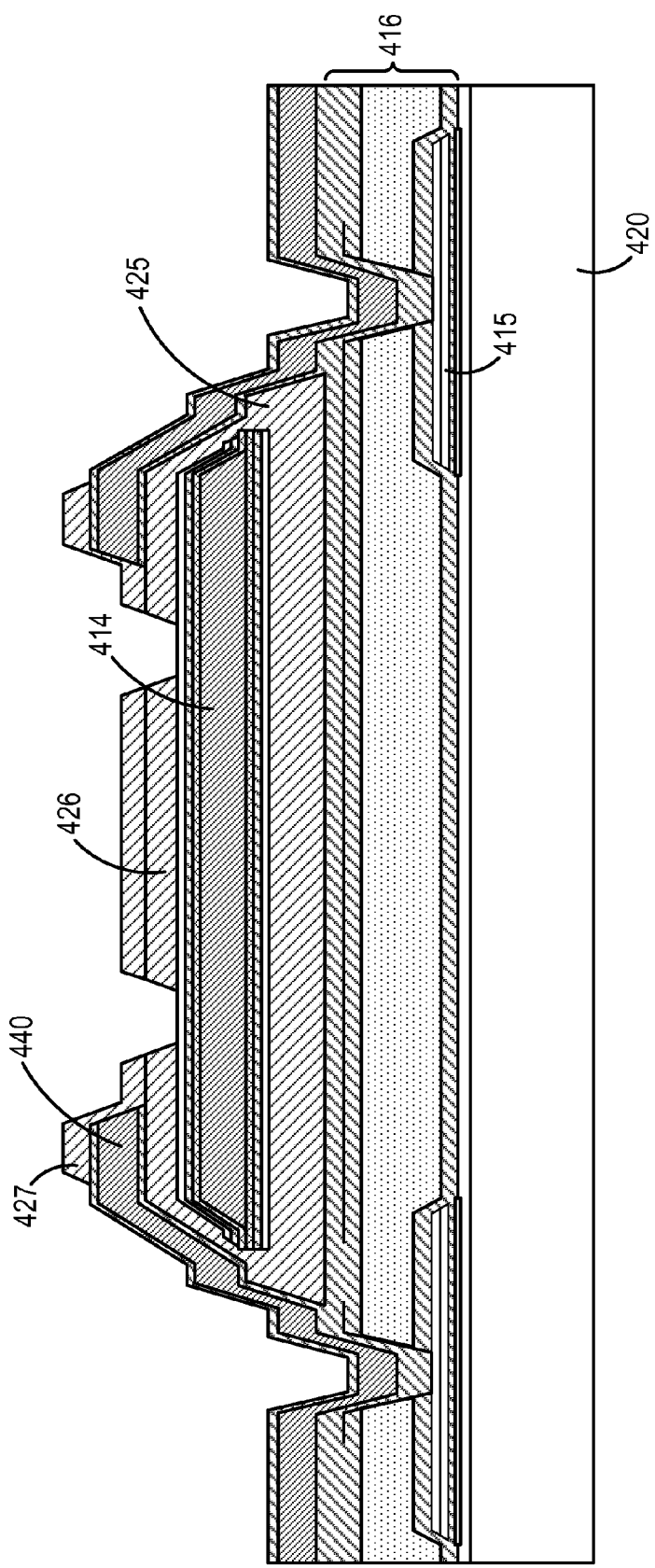

The process 300 can proceed to block 312 with the forming of a third sacrificial layer 427 over the restoring force modifiers 440. FIG. 19E shows a third sacrificial layer 427 over the restoring force modifiers 440. The third sacrificial layer 427 can be formed of similar materials and using similar processes to the first sacrificial layer 425 and/or the second sacrificial layer 426, or at least one parameter of the third sacrificial layer 427 can be different than that parameter of the first sacrificial layer 425 and/or the second sacrificial layer 426 (e.g., thickness, material, planarity, etc.). The third sacrificial layer 427 can have a suitable thickness for forming a gap between the restoring force modifier 440 and the deformable elements 434, as discussed herein. The third sacrificial layer 427 can be, for example, amorphous silicon ($\alpha$-Si) and can have a thickness of about 1000 Angstroms to about 2000 Angstroms, or about 1500 Angstroms.

Figure 19F:
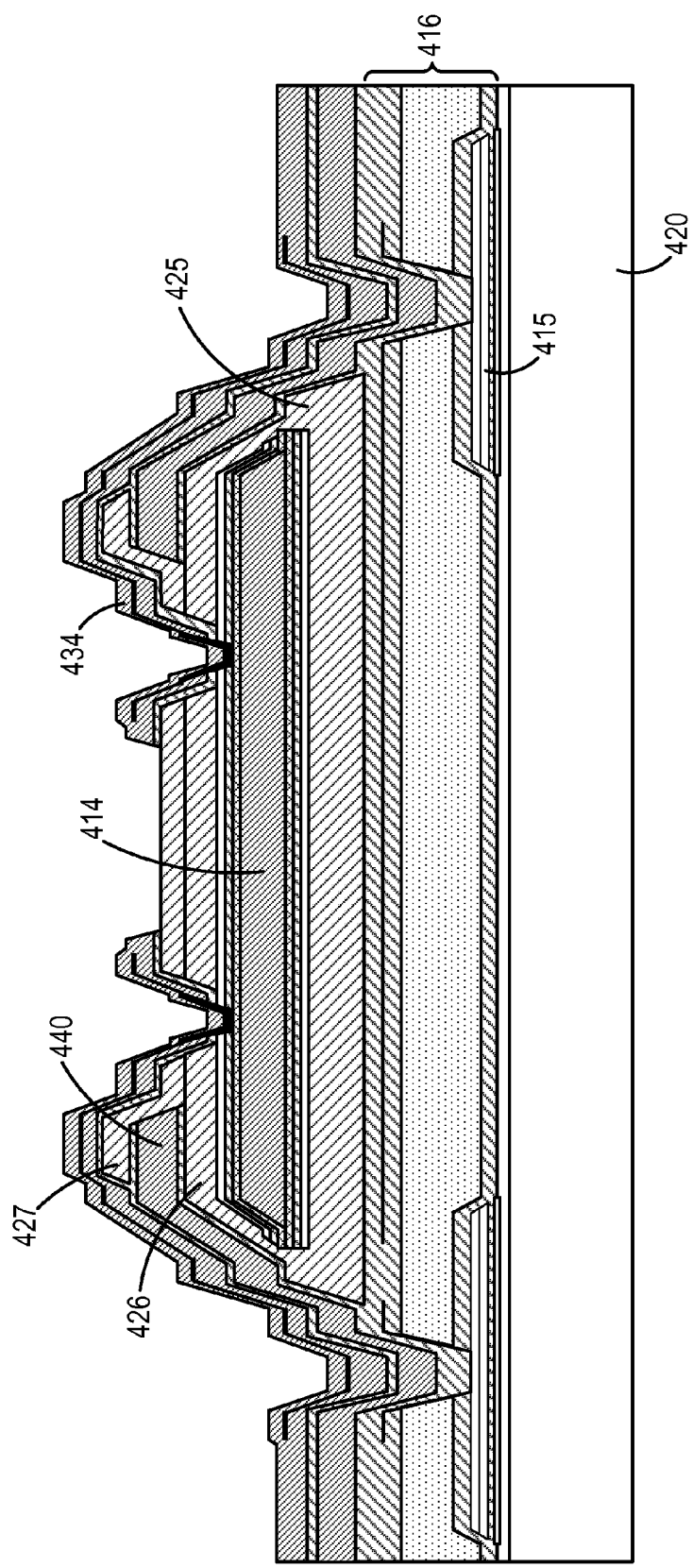

The process 300 can proceed to block 314 with the forming of the deformable elements 434. FIG. 19F shows deformable elements 434 over the third sacrificial layer 427. The deformable elements 434 can be made of materials and thicknesses that enable the deformable elements 434 to flex and bend resiliently, such that the deformable elements 434 can provide a restoring force as discussed herein (e.g., to bias movable reflector 414 to the resting position). The deformable elements 434 can be coupled to the back side of the movable reflector 414. In some implementations, the deformable elements can include an electrically conductive layer, which can be electrically connected to the electrode of the movable reflector 414. In some implementations the deformable elements 434 can include a buffer layer that can be $SiO_2$ and can have a thickness of about 150 Angstroms to about 350 Angstroms, or about 250 Angstroms, a structural layer that can be SiON and can have a thickness of about 750 Angstroms to about 1250 Angstroms, or about 1000 Angstroms, an electrically conductive layer that can be AlCu and can have a thickness of about 200 Angstroms to about 400 Angstroms, or about 300 Angstroms. Over the electrically conductive layer, the deformable elements 434 can include a structural layer that can be SiON and can have a thickness of about 750 Angstroms to about 1250 Angstroms, or about 1000 Angstroms, and a buffer layer that can be $SiO_2$ and can have a thickness of about 150 Angstroms to about 350 Angstroms, or about 250 Angstroms. An oxide layer on each side of a conductive layer can help, for example, to balance stresses due to differences in coefficient of thermal expansion, which can improve stability of the resting position. SiON can be used for the structural layer because its stress resistance (e.g., for tensile and compressive stress) can be tuned across a wide range. The $SiO_2$ layers can protect the structural layers (e.g., SiON) such as from an etchant material (e.g., $XeF_2$).

Figure 19G:
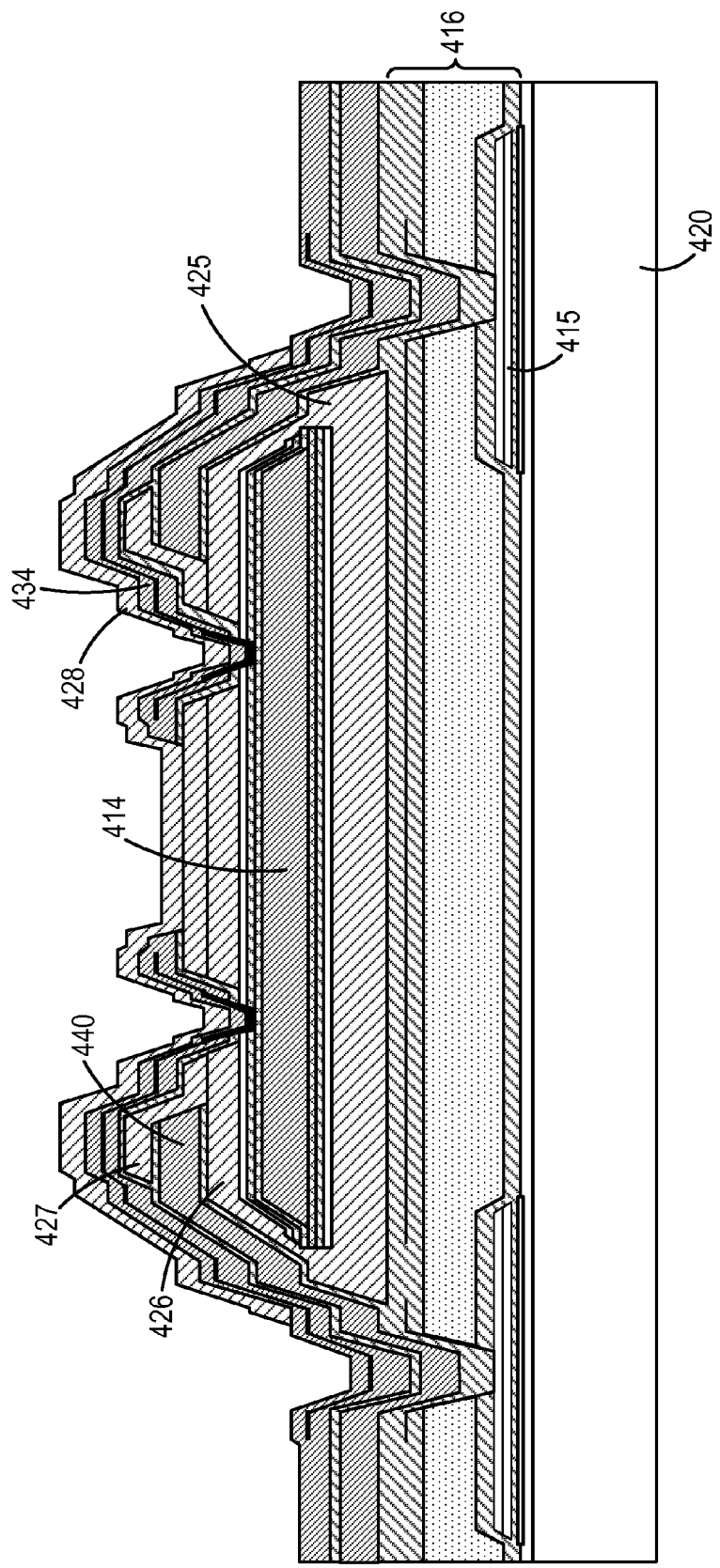

In some instances, the process 300 can proceed to block 316, and the sacrificial layers 425, 426, and 427 can be removed, as discussed in more detail below. In some instances, the process can proceed to at least partially encapsulate the structure of the IMOD 400. With reference to FIG. 19G, a fourth sacrificial layer 428 can be over the deformable elements 434. The fourth sacrificial layer 428 can be formed of similar materials and using similar processes to the first sacrificial layer 425, the second sacrificial layer 426, and/or the third sacrificial layer 427, or at least one parameter of the fourth sacrificial layer 428 can be different than that parameter of the first sacrificial layer 425, the second sacrificial layer 426, and/or the third sacrificial layer 427 (e.g., thickness, material, planarity, etc.). The fourth sacrificial layer 428 can have a suitable thickness for spacing the encapsulating layer 450, described below, from the deformable elements 434. The fourth sacrificial layer 428 can be, for example, amorphous silicon (α-Si) and can have a thickness of about 1000 Angstroms to about 2000 Angstroms, or about 1500 Angstroms.

Figure 19H:
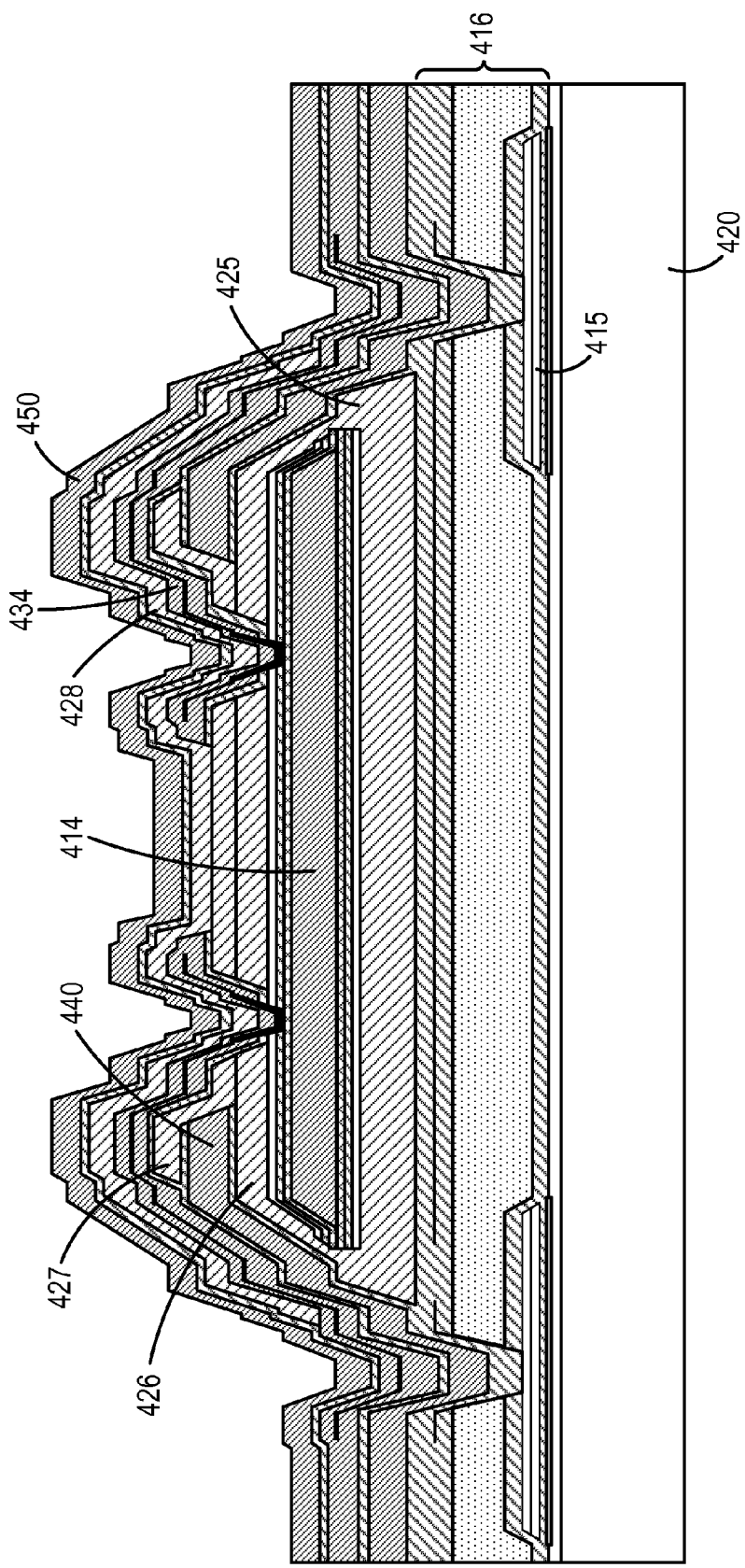
Figure 19I:
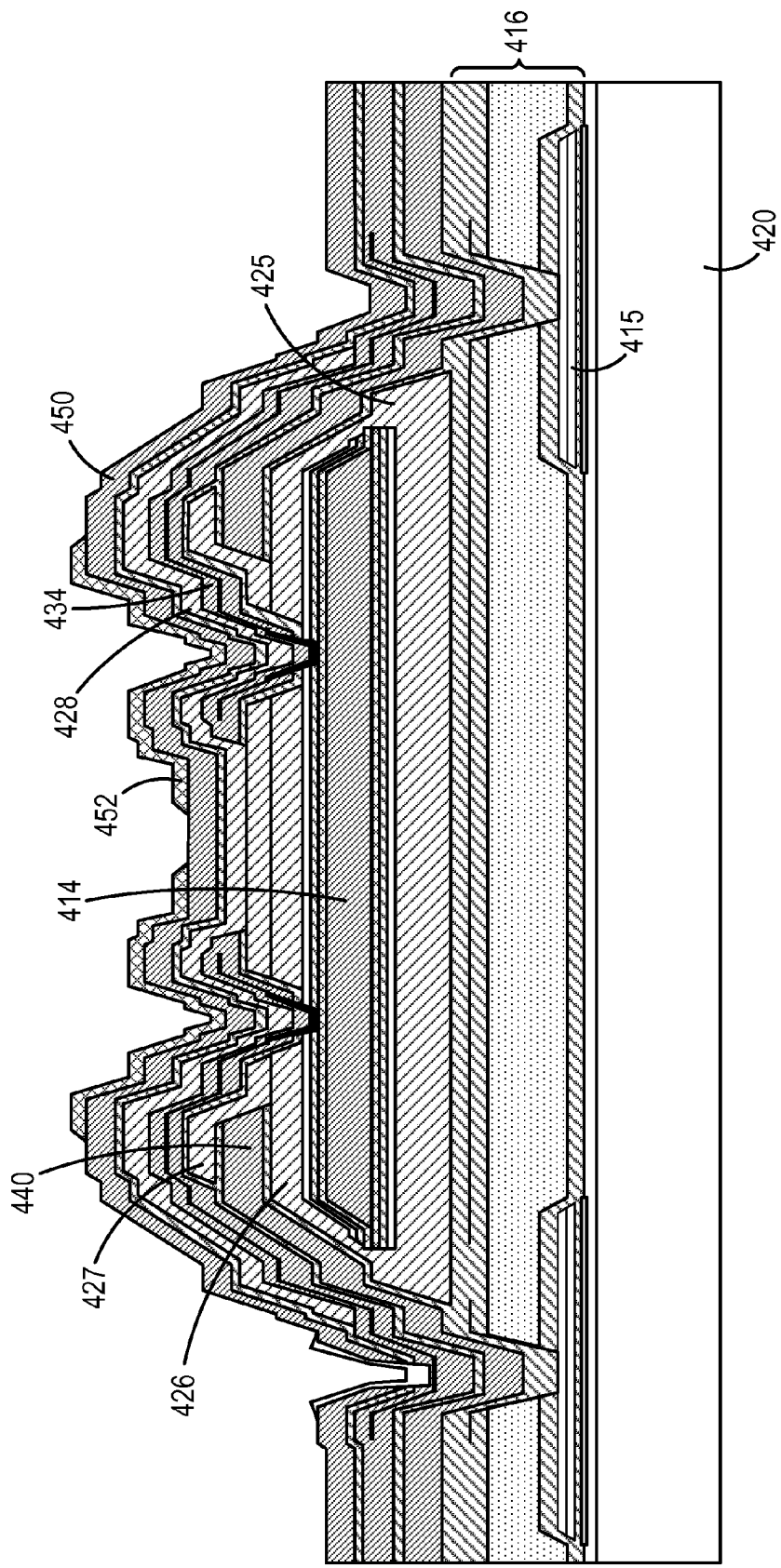
Figure 19J:
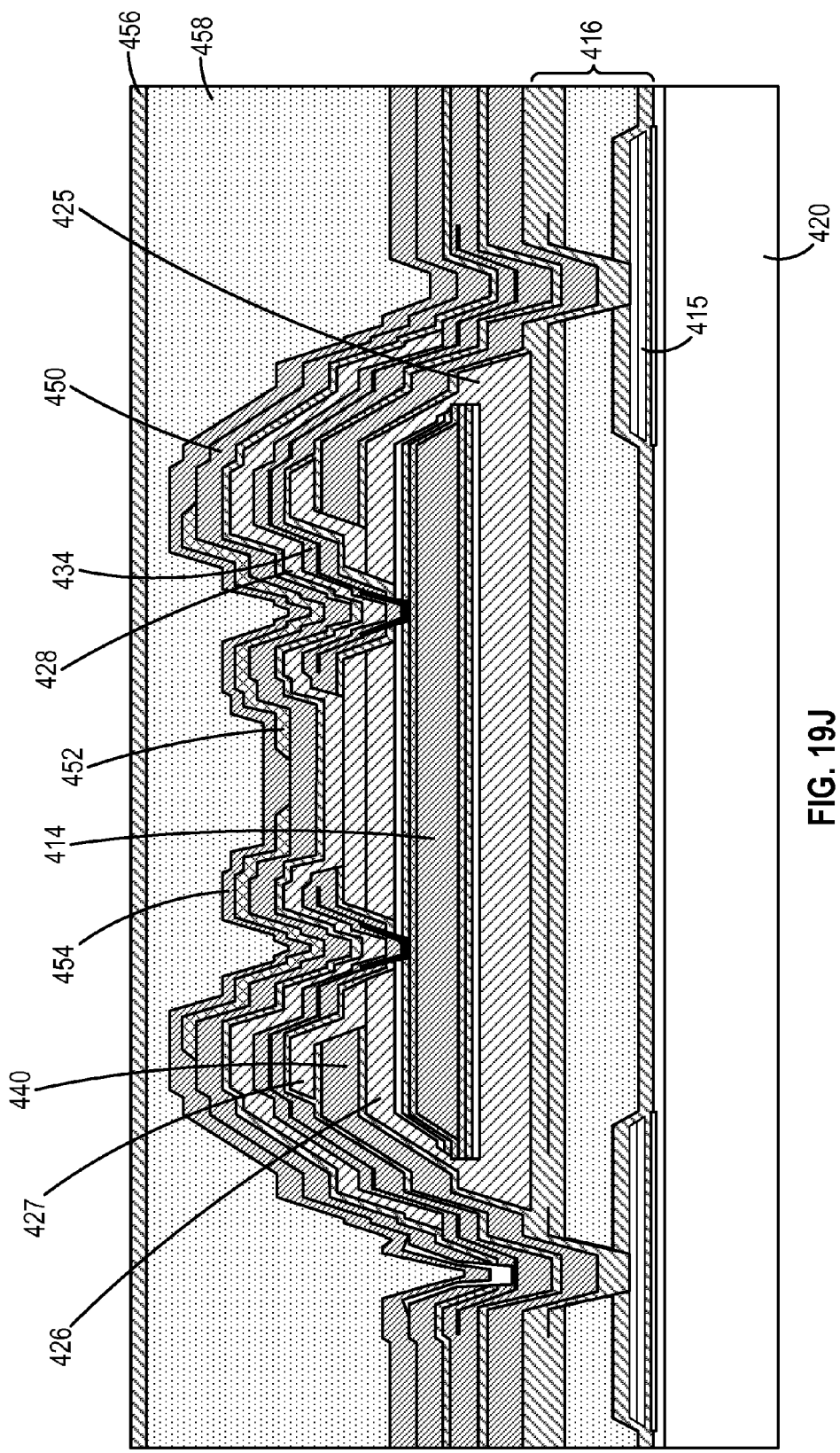
Figure 19K:
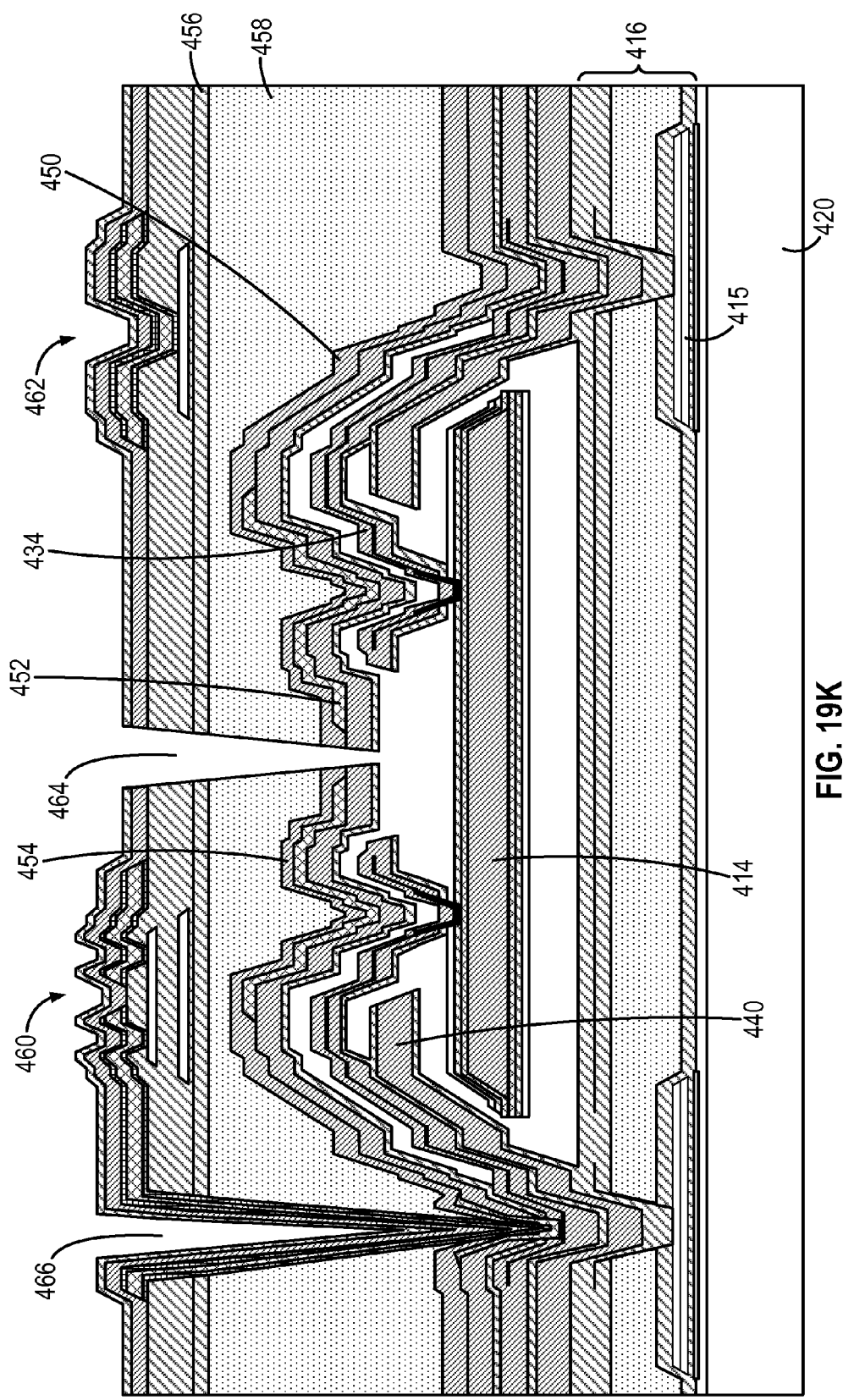

With reference to FIG. 19H, an encapsulating layer 450 can be over the fourth sacrificial layer 428. The encapsulating layer 450 can include a buffer layer that can be $SiO_2$ and can have a thickness of about 150 Angstroms to about 350 Angstroms, or about 250 Angstroms, and a structural layer that can be SiON and can have a thickness of about 4000 Angstroms to about 6000 Angstroms, or about 5000 Angstroms. With reference to FIG. 19I, a top metal layer 452 can be over the encapsulating layer 450. The top metal layer 452 can be aluminum (Al) or aluminum copper (AlCu) and can have a thickness of about 3000 Angstroms to about 12,000 Angstroms, or about 5000 Angstroms to about 10,000 Angstroms. With reference to FIG. 19J, a passivation layer 454 can be over the top metal layer 452. The passivation layer 454 can include SiON and can have a thickness of about 4000 Angstroms to about 6000 Angstroms, or about 5000 Angstroms. A planarizing layer 458 that can include SOG (e.g., with a thickness of 1000 Angstroms to about 2000 Angstroms, or about 1500 Angstroms) can be over the passivation layer 454. A capping layer 456 (e.g., including $SiO_2$ with a thickness between 750 Angstroms and 1250 Angstroms, or about 1000 Angstroms) can be over the planarizing layer 458.

With reference to FIG. 19K, thin-film transistors can be included (e.g., above the planarization layer 458. For example the IMOD 400 can include a drain 460 and a source 462. Vias (such as the via 466) can be formed in the IMOD structure, for example, to establish an electrical connection between features of the IMOD 400. For example, the electrode of the movable reflector 414 can be electrically coupled to the drain 460 via the electrically conductive layer in the deformable element 434 and through the via 466.

In some implementations, a release hole 464 can be created through layers of the IMOD structure to allow the sacrificial layers 425, 426, 427, and 428 to be removed. The fourth sacrificial layer 428 can be removed to provide a gap between the deformable elements 434 and the encapsulating layer 450. At block 316, the third sacrificial layer 427 can be removed to create a third gap between the restoring force modifier 440 and the deformable element 434. At block 320 of the process 300, the first sacrificial layer 425 can be removed to create a first gap between the optical stack 416 and the movable reflector 414. At block 318, the second sacrificial layer 426 can be removed to create a second gap between the movable reflector 414 and the restoring force modifier 440. The sacrificial layers 425, 426, 427, and 428 can be removed by exposing the sacrificial layers 425, 426, 427, and 428 to one or more etchants. The sacrificial layers 425, 426, 427, and 428 can be removed together by a single etchant. The sacrificial layers 425, 426, 427, and 428 can be removed as a single stage of the process 300. In some instances, the sacrificial layers 425, 426, 427, and 428 can be removed by two or more etchants, or by two or more stages of the process 300. An etchable sacrificial material such as Mo or amorphous Si may be removed by dry chemical etching by exposing the sacrificial layers 425, 426, 427, and 428 to a gaseous or vaporous etchant, such as vapors derived from solid $XeF_2$ for a period of time that is effective to remove the desired amount of material. Other etching methods, such as wet etching and/or plasma etching, also may be used. After removal of the sacrificial materials 425, 426, 427, and 428, the resulting fully or partially fabricated IMOD display element may be referred to herein as a "released" IMOD 400.

In some implementations, various portions of the process 300 described above can be omitted, rearranged, and modified. For example, in some implementations, the IMOD 400 is not encapsulated, and various features discussed in connection with FIGS. 19G-19K can be omitted. Various materials can be substituted for the materials that were specifically recited in the example implementations, and the thicknesses of the recited layers can vary from the ranges that were specifically discussed. Various features described in connection with the process 300 and the IMOD 400 can be used in implementations that omit some of the features described herein. For example, the deformable elements 434 and/or the movable reflector 414 can be formed similar to the example in process 300 without including a restoring force modifier 440. In some implementations, an electrical connection can be provided to the back side of the movable reflector 414 via an electrically conductive layer in the deformable elements 434. In some implements, the electrical connection can extend from the back side of the movable reflector 414 to the front side of the movable reflector 414, as discussed herein. These features can be incorporated into implementations that do not include other features discussed in connection with the process 300 and the IMOD 400.

Figure 20A:
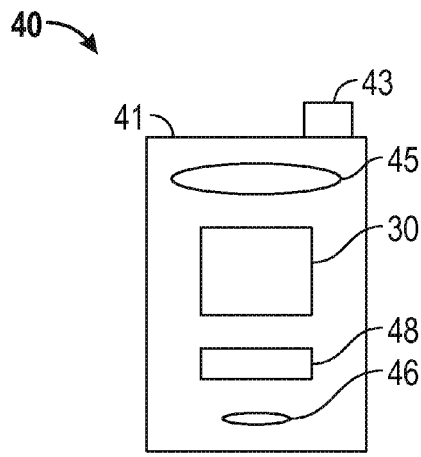
FIGS. 20A and 20B are system block diagrams illustrating a display device that includes a plurality of IMOD display elements.
Figure 20B:
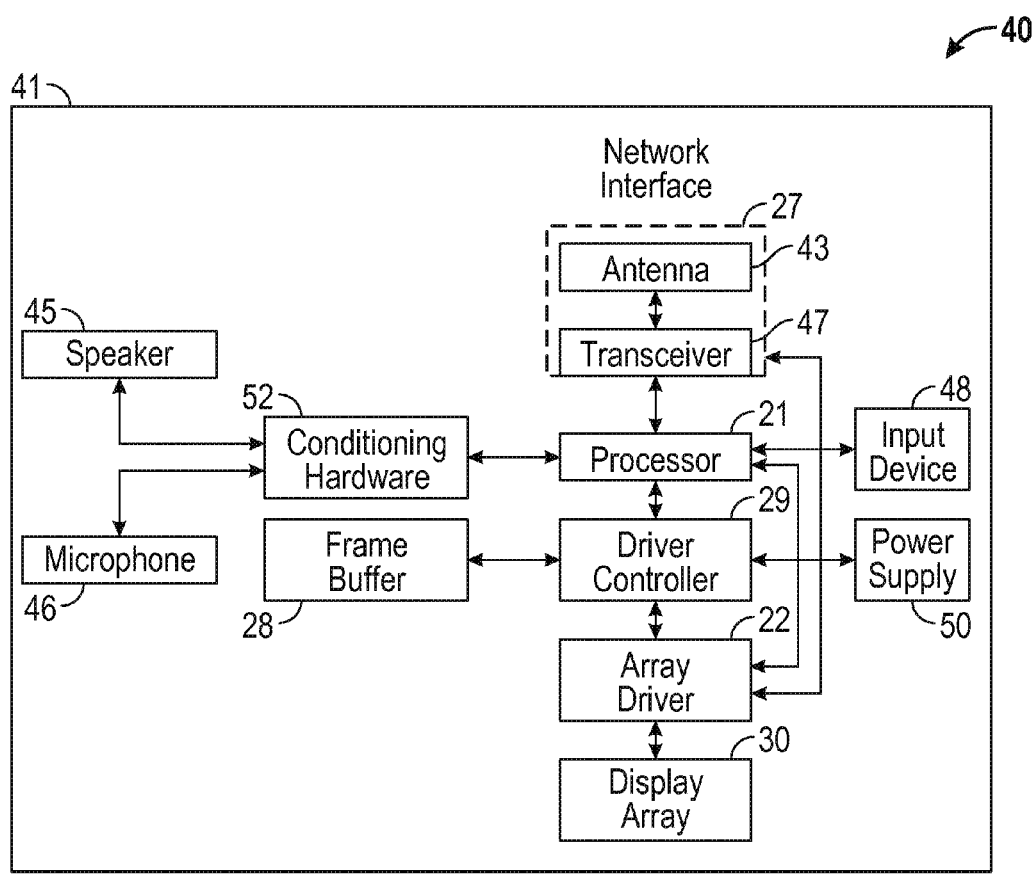

FIGS. 20A and 20B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, α-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 20A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 20A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An interferometric modulator comprising:
   a substrate;
   an optical stack supported by the substrate, wherein the optical stack is partially reflective and partially transmissive;
   a movable reflector over the optical stack, the movable reflector including a front side facing the optical stack and a back side opposite the front side, the optical stack and the movable reflector defining an optical cavity therebetween;
   a deformable element coupled to the back side of the movable reflector, wherein the deformable element is operable for providing a restoring force to bias the movable reflector to a first position; and
   a restoring force modifier between the movable reflector and the deformable element, the interferometric modulator configured such that the restoring force modifier increases the restoring force of the deformable element when the deformable element is in contact with the restoring force modifier, wherein the movable reflector is between the restoring force modifier and the optical stack.

2. The interferometric modulator of claim 1, wherein the restoring force modifier is configured such that the deformable element does not contact the restoring force modifier when the movable reflector is in the first position, the deformable element contacts the restoring force modifier when the movable reflector is in a second position, and the deformable element contacts the restoring force modifier when the movable reflector is in a third position, the second position between the first position and the third position.

3. The interferometric modulator of claim 2, wherein the deformable element has a first spring constant when the movable reflector is between the first position and the second position, and wherein the deformable element has a second spring constant that is higher than the first spring constant when the movable reflector is between the second position and the third position.

4. The interferometric modulator of claim 2, wherein the interferometric modulator is operable for reflecting a first color of light when the movable reflector is at the first position, wherein the interferometric modulator is operable for reflecting a second color of light when the movable reflector is at the second position, and wherein the interferometric modulator is operable for reflecting a third color of light when the movable reflector is at the third position.

5. The interferometric modulator of claim 1, wherein the restoring force is at least partially defined by a first length of the deformable element when the deformable element does not contact the restoring force modifier, wherein the restoring force is at least partially defined by a second length of the deformable element when the deformable element contacts the restoring force modifier, and wherein the second length is shorter than the first length.

6. The interferometric modulator of claim 1, wherein the restoring force is at least partially defined by a first region of the deformable element when the restoring force modifier is in contact with the deformable element, and wherein the restoring force is at least partially defined by the first region and a second region of the deformable element when the restoring force modifier is not in contact with the deformable element.

7. The interferometric modulator of claim 1, further comprising a post that supports the movable reflector above the optical cavity, wherein the restoring force modifier includes a protrusion extending generally horizontally from the post.

8. The interferometric modulator of claim 1, wherein a line normal to the front side of the movable reflector intersects the restoring force modifier.

9. The interferometric modulator of claim 1, wherein the interferometric modulator is operable for selectively actuating the movable reflector towards the optical stack and away from the optical stack.

10. The interferometric modulator of claim 9, further comprising a flexible element between the restoring force modifier and the movable reflector, wherein the flexible element is operable for increasing the restoring force when the movable reflector is actuated away from the optical stack.

11. The interferometric modulator of claim 9, wherein the movable reflector is operable for flexing to increase the restoring force when the movable reflector is actuated away from the optical stack.

12. The interferometric modulator of claim 9, further comprising an additional restoring force modifier, wherein the deformable element is between the movable reflector and the additional restoring force modifier, and wherein the additional restoring force modifier is operable for increasing the restoring force when the movable reflector is actuated away from the optical stack.

13. The interferometric modulator of claim 1, further comprising a second restoring force modifier, wherein the deformable element is operable for contacting the restoring force modifier when the movable reflector is at a first contacting position, wherein the deformable element is operable for contacting the second restoring force modifier when the movable reflector is deflected past the first contacting position, and wherein the second restoring force modifier further increases the restoring force when the deformable element contacts the second restoring force modifier.

14. The interferometric modulator of claim 1, wherein the movable reflector includes an electrode, and wherein the deformable element includes an electrically conductive portion that is electrically coupled to the electrode of the movable reflector.

15. The interferometric modulator of claim 14, wherein the front side of the movable reflector includes the electrode, wherein the movable reflector includes an electrically conductive layer that extends from the back of the movable reflector to the front of the movable reflector.

16. An apparatus comprising:
a plurality of display elements that each includes the interferometric modulator of claim 1;
a processor that is operable for communicating with the plurality of display elements, the processor being operable for processing image data; and
a memory device that is operable for communicating with the processor.

17. The apparatus of claim 16, further comprising:
a driver circuit operable for sending at least one signal to the plurality of display elements; and
a controller operable for sending at least a portion of the image data to the driver circuit.

18. The apparatus of claim 16, further comprising:
an image source module operable for sending the image data to the processor, wherein the image source module includes at least one of a receiver, transceiver, and transmitter.

19. The apparatus of claim 16, further comprising:
an input device operable for receiving input data and communicating the input data to the processor.

20. An interferometric modulator comprising:
a substrate;
an optical stack supported by the substrate, wherein the optical stack is partially reflective and partially transmissive;
movable means for reflecting light, the movable light reflecting means positioned over the optical stack, the movable light reflecting means including a front side facing the optical stack and a back side opposite the front side, the optical stack and the movable light reflecting means defining an optical cavity therebetween;
means for biasing the movable light reflecting means to a first position, wherein the biasing means is coupled to the back side of the movable light reflecting means; and
means for modifying a restoring force of the biasing means, the restoring force modifying means between the movable light reflecting means and the biasing means, wherein the movable light reflecting means is between the restoring force modifying means and the optical stack.

21. The interferometric modulator of claim 20, wherein the movable light reflecting means includes a movable reflector, wherein the biasing means includes a deformable element, or wherein the restoring force modifying means includes a restoring force modifier.

22. A method of manufacturing an interferometric modulator, the method comprising:
forming an optical stack over a substrate;
forming a first sacrificial layer over the optical stack;

forming a movable reflector over the first sacrificial layer, the movable reflector having a front side facing the optical stack and back side opposite the front side;

forming a second sacrificial layer over the movable reflector;

forming a restoring force modifier over the second sacrificial layer, wherein the movable reflector is between the restoring force modifier and the optical stack;

forming a third sacrificial layer over the restoring force modifier;

forming a deformable element over the third sacrificial layer;

removing the first sacrificial layer to create a first gap between the optical stack and the movable reflector;

removing the second sacrificial layer to create a second gap between the movable reflector and the restoring force modifier; and removing the third sacrificial layer to create a third gap between the restoring force modifier and the deformable element;

wherein the deformable element is coupled to the back side of the movable reflector upon removal of the sacrificial layers such that the deformable element is operable for providing a restoring force to bias the movable reflector to a first position, and wherein the interferometric modulator is configured such that the restoring force modifier increases the restoring force when the deformable element is in contact with the restoring force modifier.

23. The method of claim 22, wherein a single etchant is used for removing the first sacrificial layer, removing the second sacrificial layer, and removing the third sacrificial layer.

24. The method of claim 22, further comprising:
forming a fourth sacrificial layer over the deformable element;
forming an encapsulating layer over the fourth sacrificial layer; and
removing the fourth sacrificial layer to create a fourth gap between the deformable element and the encapsulating layer.

25. The method of claim 24, further comprising forming a hole through the encapsulating layer to provide access to the sacrificial layers.

26. The method of claim 22, wherein forming the movable reflector includes forming an electrode, and wherein forming the deformable element includes forming an electrically conductive layer that is electrically coupled to the electrode.

* * * * *